(12) United States Patent
Mukai et al.

(10) Patent No.: US 7,898,348 B2
(45) Date of Patent: Mar. 1, 2011

(54) TERAHERTZ OSCILLATION DEVICE

(75) Inventors: Toshikazu Mukai, Kyoto (JP);
 Masahiro Asada, Tokyo (JP); Safumi Suzuki, Tokyo (JP); Kenta Urayama, Tokyo (JP)

(73) Assignee: Rohm Co., Ltd., Kyoto-fu (JP)

( * ) Notice: Subject to any disclaimer, the term of this patent is extended or adjusted under 35 U.S.C. 154(b) by 22 days.

(21) Appl. No.: 12/458,969

(22) Filed: Jul. 28, 2009

(65) Prior Publication Data
 US 2010/0026401 A1 Feb. 4, 2010

(30) Foreign Application Priority Data

Jul. 29, 2008 (JP) ............................. P2008-195220
 Jun. 1, 2009 (JP) ............................. P2009-132505

(51) Int. Cl.
 *H03B 7/14* (2006.01)
(52) U.S. Cl. ............... 331/107 T; 331/96; 331/107 DP; 331/107 SL
(58) Field of Classification Search .............. 331/107 T, 331/96, 107 DP, 107 SL
 See application file for complete search history.

(56) References Cited

U.S. PATENT DOCUMENTS 4,278,951 A * 7/1981 Cachier et al. ................ 331/96
5,341,138 A * 8/1994 Ono et al. ...................... 342/20
5,675,295 A * 10/1997 Brebels et al. .............. 331/105
2009/0051452 A1* 2/2009 Asada et al. ............. 331/107 T

FOREIGN PATENT DOCUMENTS

JP 2007-124250 A 5/2007

* cited by examiner

*Primary Examiner*—Joseph Chang
(74) *Attorney, Agent, or Firm*—Rabin & Berdo, PC

(57) ABSTRACT

A terahertz oscillation device includes a first electrode placed on the semiconductor substrate; a second electrode placed via the insulating layer toward the first electrode, and opposes the first electrode to be placed on the semiconductor substrate; a MIM reflector formed between the first electrode and the second electrode by sandwiching the insulating layer; a resonator adjoining of the MIM reflector and is placed between the first electrode and the second electrode which oppose on the semiconductor substrate; an active element placed at the substantially central part of the resonator; a waveguide adjoining of the resonator and is placed between the first electrode and the second electrode which oppose on the semiconductor substrate; and a horn apertural area adjoining of the waveguide and is placed between the first electrode and the second electrode which oppose on the semiconductor substrate.

20 Claims, 29 Drawing Sheets

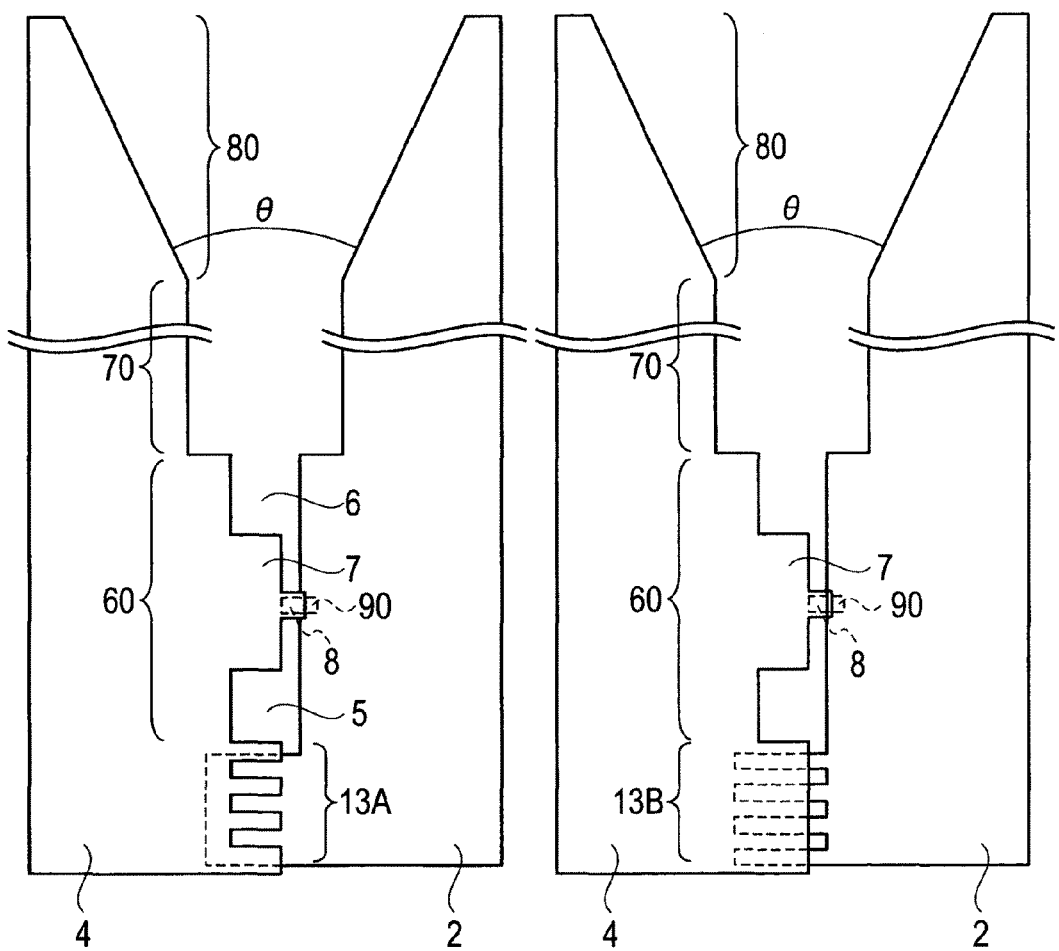

TERAHERTZ OSCILLATION DEVICE

CROSS REFERENCE TO RELATED APPLICATIONS AND INCORPORATION BY REFERENCE

This application is based upon and claims the benefit of priority from prior Japanese Patent Applications No. P2008-195220 filed on Jul. 29, 2008, and No. P2009-132505 filed on Jun. 1, 2009, the entire contents of which are incorporated herein by reference.

TECHNICAL FIELD

The present invention relates to a terahertz oscillation device. More specifically, the present invention relates to a terahertz oscillation device in which it is possible to output electromagnetic wave horizontally to a substrate, and it is easy to be integrated.

BACKGROUND ART

In recent years, since the miniaturization of electron devices, such as a transistor, progresses and this size has nanometer size, the new phenomenon called a quantum effect is observed. Then, the development, which aimed at achieving of an ultra high-speed device or a new functional device, is advanced using the quantum effect.

On the other hand, the trial which performs large capacity communication, the information processing, imaging or measurement, etc. is performed in such environment using the frequency domain which is called a terahertz band in particular, and whose frequency is 1 THz ($10^{12}$ Hz) to 10 THz. This frequency domain is undeveloped frequency region between light and electromagnetic wave, and if the device, which operates with this frequency band, is achieved, being used for many uses, such as measurement in various fields, such as physical characteristics, astronomy, living things, etc. the imaging, the large capacity communication and the information processing mentioned above, is expected.

As a device, which oscillates the high frequency electromagnetic wave of the frequency of the terahertz band, the structure which integrates a minute slot antenna on active devices, such as a transistor and a diode, is known (for example, refer to Non Patent Literature 1).

Moreover, a device, having a structure which adds metal and an insulation layer on a slot transmission line of both terminals of antenna to be short-circuited in high frequency, is disclosed (for example, refer to Non Patent Literatures 1 and 2). The oscillation device has the characteristics, such that the production is easy and it is suitable for the miniaturization.

Moreover, in order to prevent the leakage of a high frequency electromagnetic wave, the method of short-circuiting completely in high frequency and reflecting the leakage by providing a resonance stub in the slot transmission line of antenna both terminals, is proposed. The method by the resonance stub is a method of using that the electromagnetic wave which entered into the transmission line are short-circuited equivalently in the position of the stub by adding the resonant circuit composed of a stub transmission line of the length of a quarter-wavelength to a part of transmission line. According to the method, since it is decided that the length of the stub is a quarter-wavelength against the wavelength of the inputted electromagnetic wave, it is effective in indicating strong resonance only for specific frequency, and short-circuiting only the frequency and reflecting strongly.

FIG. 1 is a schematic bird's-eye view of an oscillation device produced by combining RTD (Resonant Tunneling Diode) and a slot antenna. An active element 109 composed of RTD is placed near the center of a slot antenna 100, metal and an insulator are laminated by the both terminals of the slot antenna 100, and thereby a MIM (Metal Insulator Metal) structure which inserts the insulator with the electrode metal above and below is formed. In this case, the MIM structure is composed of a second electrode 104/an insulating layer 103/a first electrode 102, and is short-circuited in high frequency.

In the second electrode 104, two recessed regions 105 and 106 are formed in the central part overlapping via the first electrode 102 and the insulating layer 103. A protruded region 107 is formed in the state of being inserted into these two recessed regions 105 and 106. A salient region 108 is formed at the approximately central part of the protruded region 107 of the second electrode 104. The active element 109 is placed so as to be inserted between the second electrode 104 and the first electrode 102 at the lower part of the salient region 108. In addition, DC power supply 115 is connected between the second electrode 104 and the first electrode 102, and a parasitic oscillation suppression resistance 114 formed with materials, such as bismuth (Bi), is connected between the second electrode 104 and the first electrode 102 in order to prevent a parasitic oscillation.

SI (Semi-Insulating) InP is used as a component of the semiconductor substrate 101. The slot antenna 100 made at the both sides of the RTD serves as a resonator and a radiation antenna of electromagnetic wave. This oscillation device has a structure where the electromagnetic wave is emitted to an upward and downward two-way for the semiconductor substrate 101. Accordingly, for example, as shown in FIG. 2, it is necessary to newly provide a silicon hemispherical lens 120 for concentrating the electromagnetic wave (hv) emitted to an upward and downward vertical direction.

In the conventional terahertz oscillation device shown in FIG. 1, the active elements 109 placed on the same plane as the insulating layer 103, such as a transistor and a diode, are placed in the central part of the slot antenna 100, the both terminals of a slot transmission line is curved rectangular, and this part is covered by a layered structure of metal/insulator/metal. Accordingly, the part covered by the layered structure of metal/insulator/metal composes RF reflection units 150a and 150b, is short-circuited in high frequency, and thereby the slot antenna 100 is composed. Since this slot antenna 100 is an opened state in direct current, it can supply a direct current to the active element 109.

In FIG. 1 and FIG. 2, since the upper side of the slot antenna 100 is the air, the relative dielectric constant $\in_{air}=1$ is satisfied. Since the lower part of the slot antenna 100 uses an InP substrate as the semiconductor substrate 101, the relative dielectric constant $\in_{InP}=12.1$ is satisfied. Here, the rate of an oscillation output to the lower part of the slot antenna 100 for whole oscillation output is expressed by $\in_{InP}^{3/2}/(\in_{air}^{3/2}+\in_{InP}^{3/2})=0.97$. That is, about 97% of the oscillation output is emitted to the InP substrate side among the whole oscillation output.

The oscillation of 1.02 THz ($10^{12}$ Hz) of terahertz bands is achieved at room temperature by the oscillation device of this structure (refer to Non Patent Literature 3). That is, according to the prototyped device, the oscillation frequency of the fundamental wave is 342 GHz, and the output is 23 µW. Then, it is reported that the electromagnetic wave of 1.02 THz is simultaneously outputted as a third higher harmonic wave of a fundamental wave, and the output of this third higher harmonic wave is 0.59 µW (refer to Non Patent Literature 3).

However, since the oscillation device proposed by these Non Patent Literatures 1, 2, and 3 had an insufficient high frequency short circuit structure, there was a problem that the loss of leakage in the direction perpendicular to the direction, where a high frequency electromagnetic wave oscillates (that is, horizontal direction), occurs, and the high output power can not be obtained. That is, in the terahertz oscillation device of structure as shown in FIG. 1, since the electric power of the electromagnetic wave oscillated to the target direction has only about 3%, practical use is not provided.

Moreover, in the method of providing the resonance stub at the slot transmission line of the both terminals of the antenna in order to reflect the leakage of high frequency power, when the active element used for the oscillation device had the characteristic of a frequency variable, and when the electromagnetic wave with comparatively wide bandwidth is oscillated, a high-output power oscillation was not able to be performed by reflecting the leakage power over the whole region of the oscillating frequency. That is, according to the method of providing the stub transmission line of a quarter-wavelength on the slot path which the leakage of electromagnetic wave occurs, even if it is effective in the short circuit and reflection for specific frequency, there was a problem that it could not be effectively reflected for the electromagnetic wave having a frequency band of broadband.

This is because it does not become perfect resonance when the stub transmission line added for the wavelength of the electromagnetic wave oscillated is not in agreement with the length of the quarter wavelength of electromagnetic wave, so the short circuit and the reflection are unsatisfactory. However, even if the length of the stub transmission line is not the quarter wavelength of electromagnetic wave, it is confirmed that a certain amount of weak reflection occurs. Therefore, if such a stub transmission line is added to multi stages at the interval fixed in the middle of the transmission line, the reflection by the added stub transmission line is synthesized. Alternatively, if the phase is uniformed to some extent, the reflection by the added stub transmission line can be reinforced. As a result, the strong reflection can be achieved also for the frequency having wide width not only for specific frequency.

On the other hand, it is disclosed also about a terahertz oscillation device which can eliminate the leakage from a slot transmission line over the oscillation frequency whole region, and can oscillate a high-efficiency and high-output electromagnetic wave even if it is the electromagnetic wave of a frequency band with the comparatively wide bandwidth oscillated from the oscillation device of a frequency variable (for example, refer to Patent Literature 1). In Patent Literature 1, by providing a stub of multi stages in the both ends of the minute slot antenna including an active device composed of RTD etc., reflecting the frequency band of the electromagnetic wave having comparatively wide bandwidth from the multi stage stub, and providing the multi stage stub circuit, since the leakage of the electromagnetic wave oscillated from the active element is reflected and returns to the active element, a high-output oscillation output with wide bandwidth is obtained, and also when the active element used for the oscillation device is a frequency variable, a high oscillation output is obtained corresponding to the frequency variable.

Citation List

Patent Literature 1: Japanese Patent Application Laying-Open Publication No. 2007-124250

Non-Patent Literature 1: Orihashi, S. Hattori, and M. Asada: "Millimeter and Submillimeter Oscillators Using Resonant Tunneling Diode and Slot Antenna with Stacked-Layer Slot Antenna", Jpn.J.Appl.Phys. vol. 67, L1309 (2004).

Non-Patent Literature 2: Orihashi, S. Hattori, and M. Asada: "Millimeter and Submillimeter Oscillator Using Resonant Tunneling Diode and Slot Antenna with a novel RF short structure", Int. Conf. Infrared and Millimeter Waves (IRMMW2004), Karlsruhe (Germany), M5.3 (September 2004) pp. 121-122.

Non-Patent Literature 3: Orihashi, S. Suzuki, and M. Asada: "Harmonic Generation of 1 THz in Sub-THz Oscillating Resonant Tunneling Diode", IRMMW2005/THz2005, The Joint 30th International Conference on Infrared and Millimeter Waves and 13th Infrared Conference on Terahertz Electronics, 2005.9.19-23

SUMMARY OF THE INVENTION

Technical Problem

However, as for the oscillation devices disclosed in Non Patent Literature 3 and Patent Literature 1, since the electromagnetic wave is emitted in the direction perpendicular to the substrate, as shown in FIG. 2, the silicon hemispherical lens 120 for concentrating the electromagnetic wave (hv) emitted to an upward and downward vertical direction newly needed to be provided, and therefore there was a problem when integrated on the substrate.

The purpose of the present invention is to provide a terahertz oscillation device with easy integration, which can oscillate the electromagnetic wave of a frequency band with the comparatively wide bandwidth oscillated from a frequency variable oscillation device, in a horizontal direction to the substrate over the oscillation frequency whole region by a high-efficiency and high power.

Solution to Problem

According to an aspect of the invention, a terahertz oscillation device comprises a semiconductor substrate; a first electrode placed on the semiconductor substrate; an insulating layer placed on the first electrode; a second electrode which is placed via the insulating layer toward the first electrode, and opposes the first electrode to be placed on the semiconductor substrate; a MIM reflector formed between the first electrode and the second electrode by sandwiching the insulating layer; a resonator which is adjoining of the MIM reflector and is placed between the first electrode and the second electrode which oppose on the semiconductor substrate; an active element placed at the substantially central part of the resonator; a waveguide which is adjoining of the resonator and is placed between the first electrode and the second electrode which oppose on the semiconductor substrate; and a horn apertural area which is adjoining of the waveguide and is placed between the first electrode and the second electrode which oppose on the semiconductor substrate.

According to another aspect of the invention, a terahertz oscillation device comprises a semiconductor substrate; a first electrode placed on the semiconductor substrate; an insulating layer placed on the first electrode; a second electrode which is placed via the insulating layer toward the first electrode, and opposes the first electrode to be placed on the semiconductor substrate; a slot line electrode which is adjoining of the first electrode on the semiconductor substrate, and is placed in an opposite side of the second electrode opposing the first electrode; a slot line electrode which is adjoining of the second electrode on the semiconductor substrate, and is placed in an opposite side of the first electrode opposing the second electrode; a MIM reflector formed between the first electrode and the second electrode by sandwiching the insulating layer; a resonator which is adjoining of the MIM reflector and is placed between the first electrode and the second electrode which oppose on the semiconductor substrate; an active element placed at the substantially central part of the resonator; a first horn waveguide which is adjoining of the resonator and is placed between the first electrode and the second electrode which oppose on the semiconductor substrate; a first horn apertural area which is adjoining of the first waveguide and is placed between the first electrode and the second electrode which oppose on the semiconductor substrate; a second waveguide placed between the first electrode and the first slot line electrode which oppose on the semiconductor substrate; a second horn apertural area which is adjoining of the second waveguide and is placed between the first electrode and the first slot line electrode which oppose on the semiconductor substrate; a third waveguide placed between the second electrode and the second slot line electrode which oppose on the semiconductor substrate; and a third horn apertural area which is adjoining of the third waveguide and is placed between the second electrode and the second slot line electrode which oppose on the semiconductor substrate.

Advantageous Effects Of Invention

According to the present invention, the terahertz oscillation device with easy integration, which can oscillate the electromagnetic wave of the frequency band with the comparatively wide bandwidth oscillated from the oscillation device of the frequency variable in the horizontal direction to the substrate over the oscillation frequency whole region by the high-efficiency and high power, can be provided.

According to the present invention, the terahertz oscillation device, which can output the electromagnetic wave efficiently in the direction horizontal to the substrate by having not only has the apertural area, but the waveguide and the horn apertural area, can be provided.

BRIEF DESCRIPTION OF DRAWINGS

FIG. 16A is a schematic plan view of an electrode pattern structure of a terahertz oscillation device according to a modified example 1 of the first embodiment of the present invention.

FIG. 16B is a schematic plan view of an electrode pattern structure of a terahertz oscillation device according to a modified example 2 of the first embodiment of the present invention.

DESCRIPTION OF EMBODIMENTS

Figure 1:
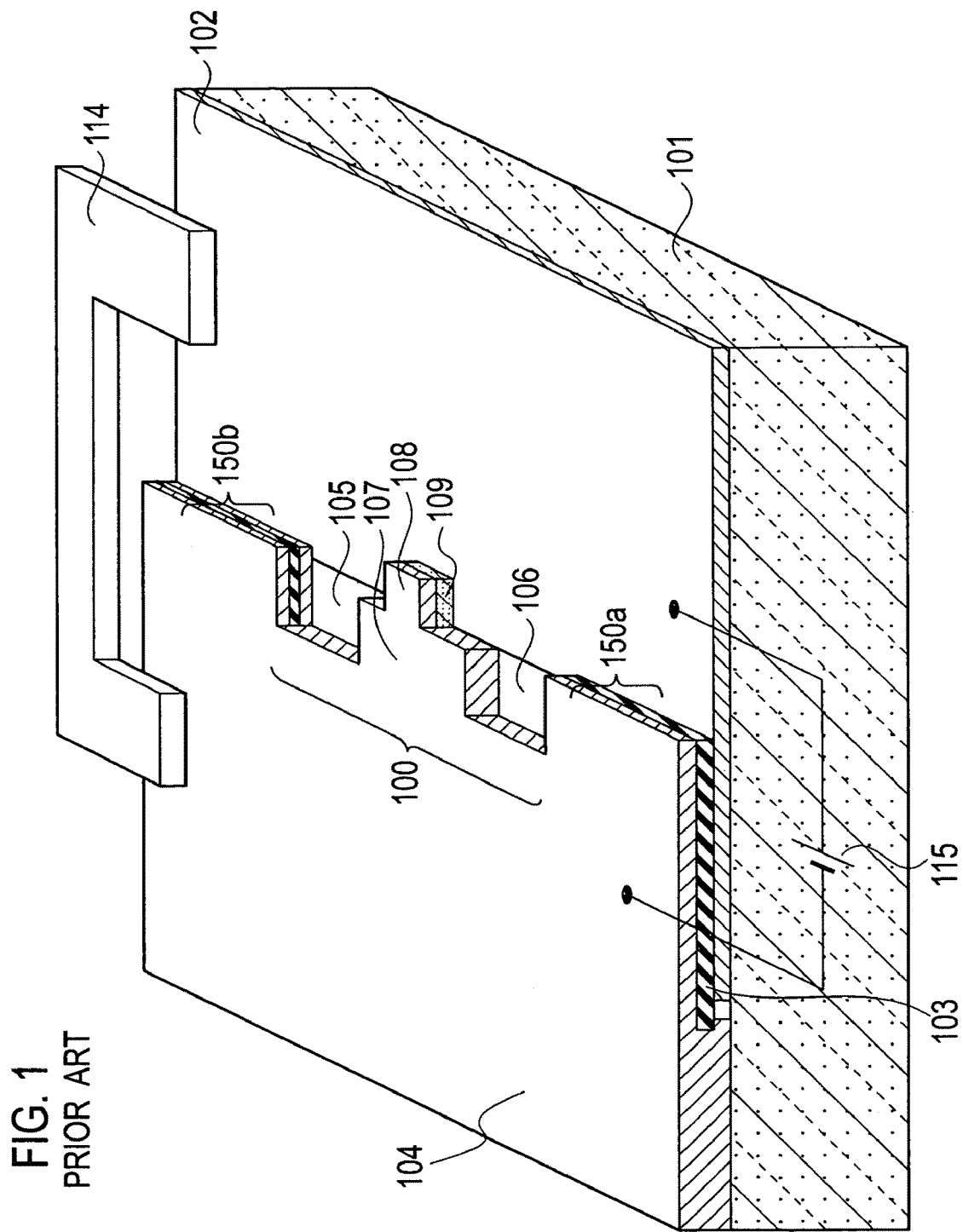
FIG. 1 is a schematic bird's-eye view showing a structure of a conventional terahertz oscillation device.
Figure 2:
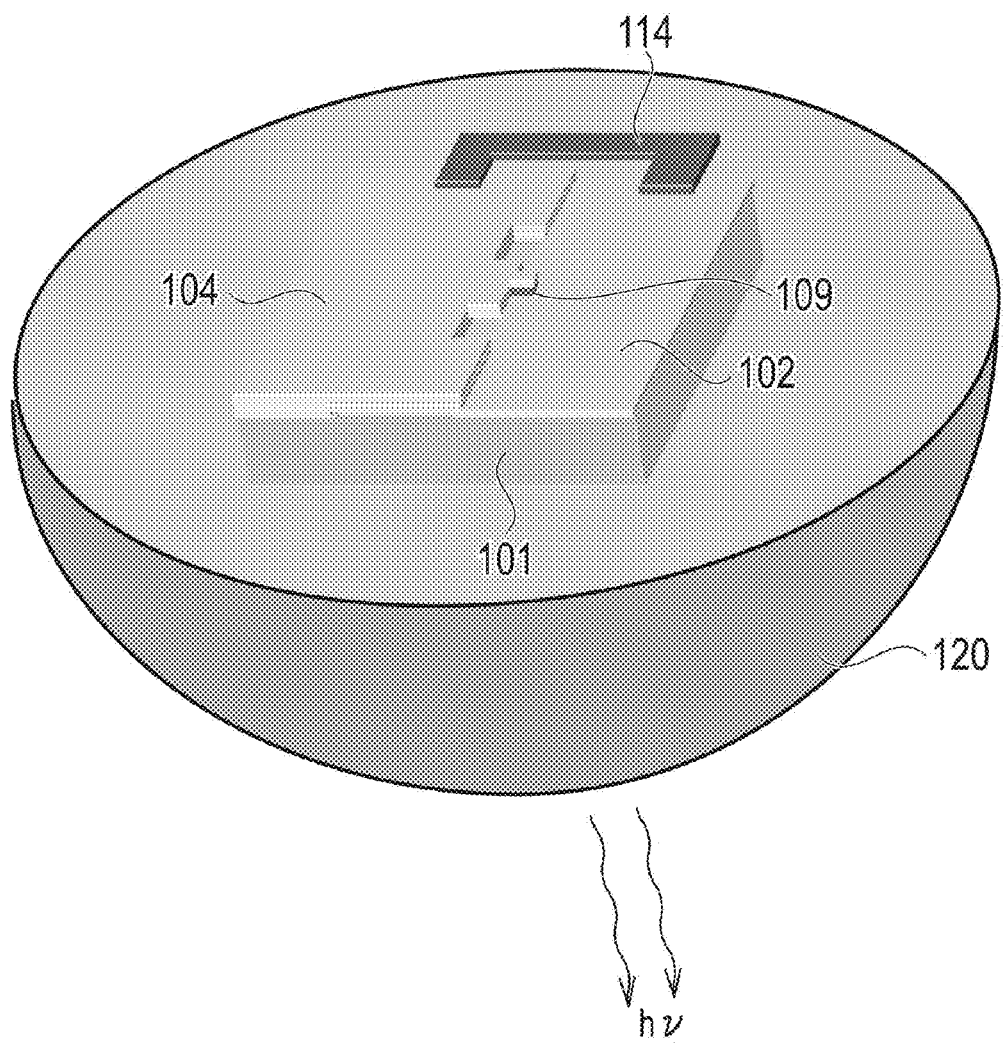
FIG. 2 is a schematic bird's-eye view showing a structure of the conventional terahertz oscillation device placed on a silicon hemispherical lens.

There will be described embodiments of the present invention, with reference to the drawings, where like members or elements are designated by like reference characters to eliminate redundancy, and some layers and their subsidiary regions are designated by the same reference characters for simplicity. Drawings are schematic, not actual, and may be inconsistent in between in scale, ratio, etc.

The embodiments to be described are embodiments of a technical concept or spirit of the present invention that is not limited to embodied specifics, and may be changed without departing from the spirit or scope of claims.

First Embodiment

Figure 3:
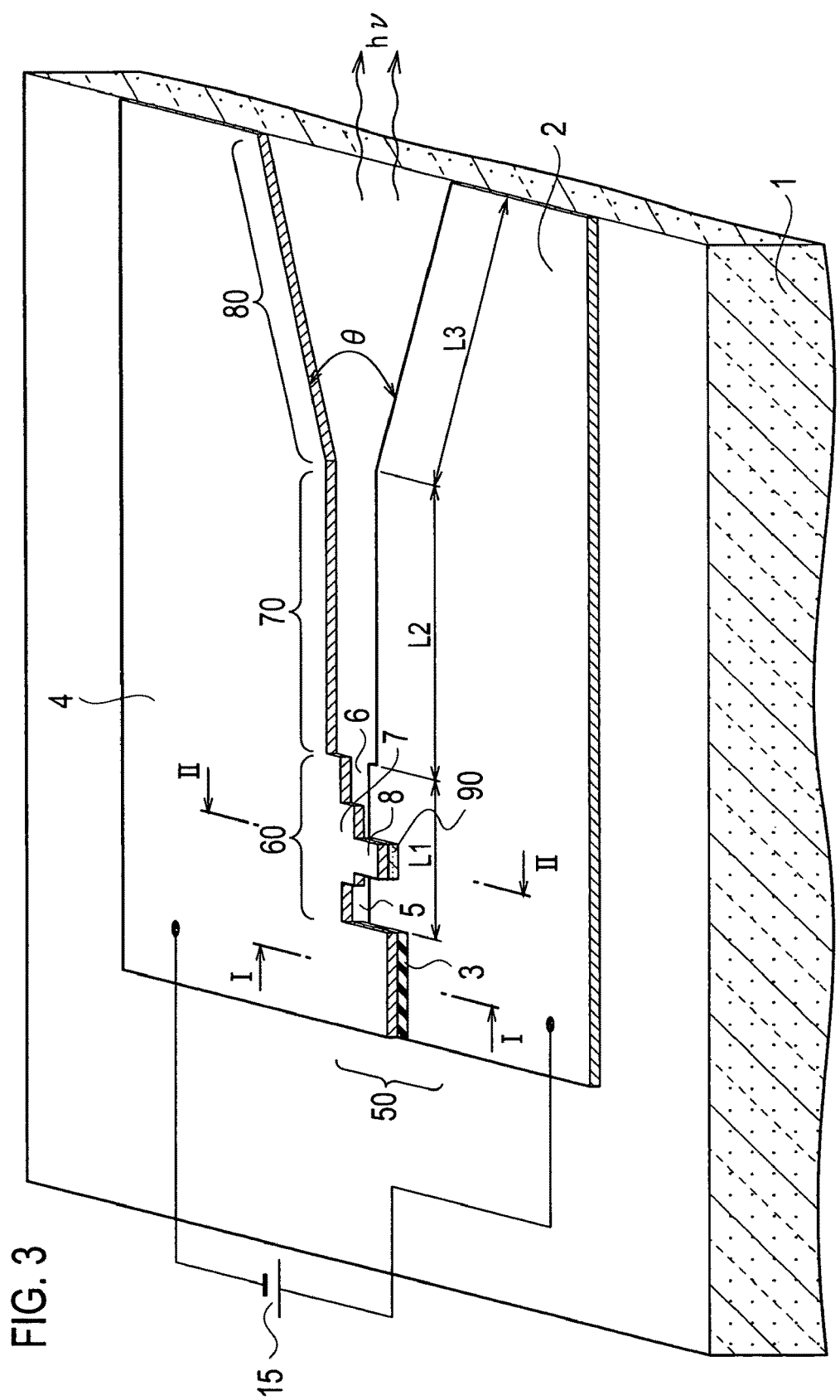
FIG. 3 is a schematic bird's-eye view of a terahertz oscillation device according to a first embodiment of the present invention.
Figure 4:
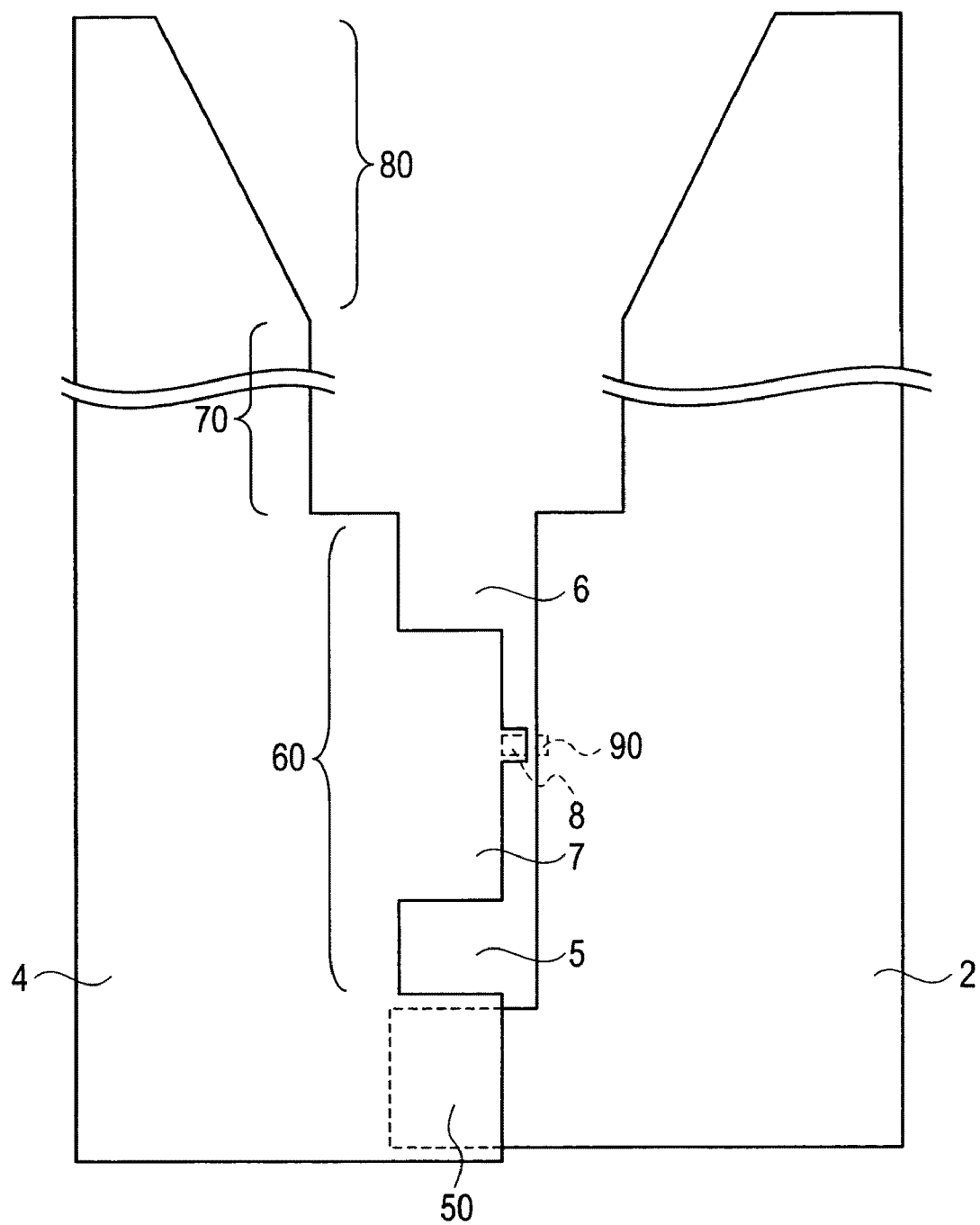
FIG. 4 is a schematic plan view of an electrode pattern structure corresponding to FIG. 3.

A schematic bird's-eye view of a terahertz oscillation device according to a first embodiment of the present invention is expressed as shown in FIG. 3, and a schematic plan view of an electrode pattern structure corresponding to FIG. 3 is expressed as shown FIG. 4.

As shown in FIG. 3 and FIG. 4, the terahertz oscillation device according to the first embodiment includes a semiconductor substrate 1; a first electrode 2 placed on the semiconductor substrate 1; an insulating layer 3 placed on the first electrode 2; a second electrode 4 which is placed via the insulating layer 3 toward the first electrode 2, and opposes the first electrode 2 to be placed on the semiconductor substrate 1; a MIM reflector 50 formed between the first electrode 2 and the second electrode 4 by sandwiching the insulating layer 3, a resonator 60 which is adjoining of the MIM reflector 50 and is placed between the first electrode 2 and the second electrode 4 which oppose on the semiconductor substrate 1; an active element 90 placed at a substantially central part of the resonator 60; a waveguide 70 which is adjoining of the resonator 60 and is placed between the first electrode 2 and the second electrode 4 which oppose on the semiconductor substrate 1; and a horn apertural area 80 which is adjoining of the waveguide 70 and is placed between the first electrode 2 and the second electrode 4 which oppose on the semiconductor substrate 1.

Although RTD is typical as the active element 90, it can compose also from the diodes and transistors except the RTD. As other active elements, for example, a TUNNETT (Tunnel Transit Time) diode, an IMPATT (Impact Ionization Avalanche Transit Time) diode, a GaAs based FET (Field Effect Transistor), a GaN based FET, HEMT (High Electron Mobility Transistor), an HBT (Heterojunction Bipolar Transistor), etc. are also applicable.

The horn apertural area 80 is composed of an aperture horn antenna. As for the angular aperture θ of the horn apertural area, it is preferable to set to not more than about 10 degrees, for example at the point of giving the directional characteristics to the radiation direction of electromagnetic wave (hν). The length L3 of the horn apertural area 80 is not more than about 700 μm, for example. The aperture width in the tip region of the horn apertural area 80 is about 160 μm, for example.

The waveguide 70 is placed at the apertural area of the resonator 60. The length L2 of the waveguide 70 is not more than about 700 μm, for example. Moreover, the interval between the first electrode 2 and the second electrode 4 in the waveguide 70 is about 24 μm, for example.

In addition, the horn shape of the horn apertural area 80 is a structure needed in order to output the electromagnetic wave in the air. The electromagnetic wave can be efficiently outputted with sufficient impedance matching in the air by the horn shape. In addition, the shape of the horn may be not only linearity shape but also a nonlinear shape, a curve profile, a secondary curve profile, a parabola shape, a stair-like shape, etc.

Two recessed regions 5 and 6 are formed, and a protruded region 7 is inserted between these two recessed regions 5 and 6, in the resonator 60. A salient region 8 is formed in the substantially central part of the protruded region 7 of the second electrode 4, and an active element 90 is placed at a lower part of this salient region 8 as inserted between the salient region 8 and the first electrode 2.

The length L1 of the resonator 60 is not more than about 30 μm, for example. The length of the salient region 8 is not more than about 6 μm, for example. Moreover, the width between the recessed regions 5 and 6 (interval of the first electrode 2 and the second electrode 4) is about 4 μm, for example. The size of the active element 90 is about 1.4 μm$^2$, for example. However, the size of the active element 90 is not be limited to this value, and may be not more than about 5.3 μm$^2$, for example. The detailed structure of the active element 90 will be described later. The size of each part of the resonator 60 is not limited to the above-mentioned size, and is suitably set up on a design according to the frequency of the electromagnetic wave to oscillate.

Moreover, as shown in FIG. 3, the interval between the first electrode 2 and the second electrode 4 of the part in which the resonator 60 is formed is narrower compared with the interval between the first electrode 2 and the second electrode 4 in the waveguide 70.

The MIM reflector 50 is placed at the closed unit of the opposite side of the apertural area of the resonator 60. By the layered structure of the MIM reflector 50 composed of metal/insulator/metal, the second electrode 4 and the first electrode 2 are short-circuited in high frequency.

In addition, in this case, the MIM reflector 50 has the effect that it is possible to reflect high frequency as the MIM reflector 50 is opening in direct current.

The semiconductor substrate 1 is formed of a semi insulating InP substrate, for example, and the thickness is about 600 μm, for example.

Both of the first electrode 2 and the second electrode 4 are composed of metal layered structure of Au/Pd/Ti, for example, and the Ti layer is a buffer layer for making satisfactory a contact state with the semi insulating InP substrate. The thickness of the first electrode 2 and the second electrode 4 is about several 100 nm, for example. In addition, both of the first electrode 2 and the second electrode 4 can be formed by a vacuum evaporation technique or a spattering technique.

The insulating layer 3 can be formed of SiO$_2$ film, for example. In addition to this, an Si$_3$N$_4$ film, an SiON film, an HfO$_2$ film, an Al$_2$O$_3$ film, etc. are also applicable. In addition, the thickness of the insulating layer 3 can be decided in consideration of the geometric plane size of the MIM reflector 50 and the required capacitor value on circuit characteristics, for example, and is several 10 nm to several 100 nm. The insulating layer 3 can be formed by a CVD (Chemical Vapor Deposition) method or a spattering technique, etc.

Figure 5A:
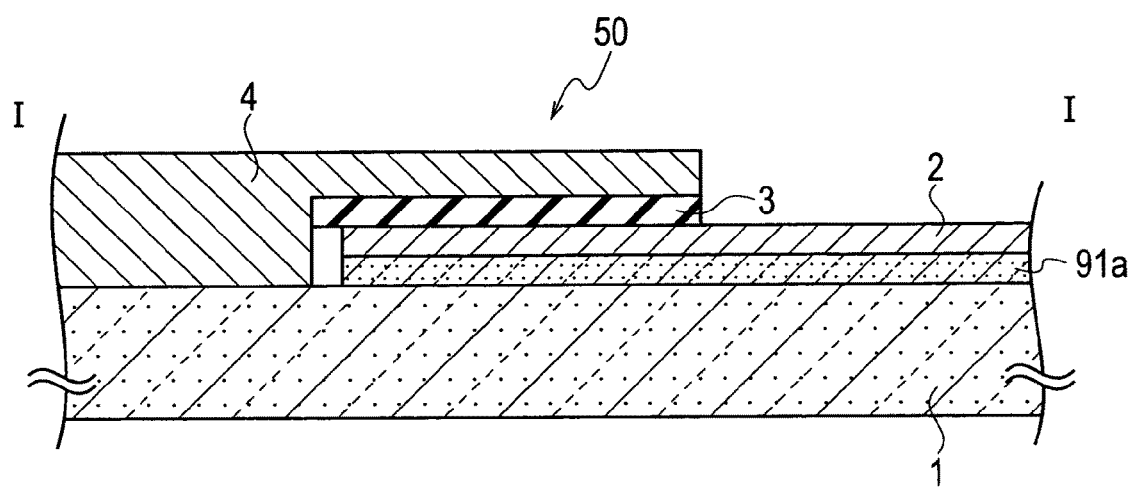
FIG. 5A is a schematic cross-sectional configuration chart taken in the line I-I of FIG. 3 in the terahertz oscillation device according to the first embodiment of the present invention.
Figure 5B:
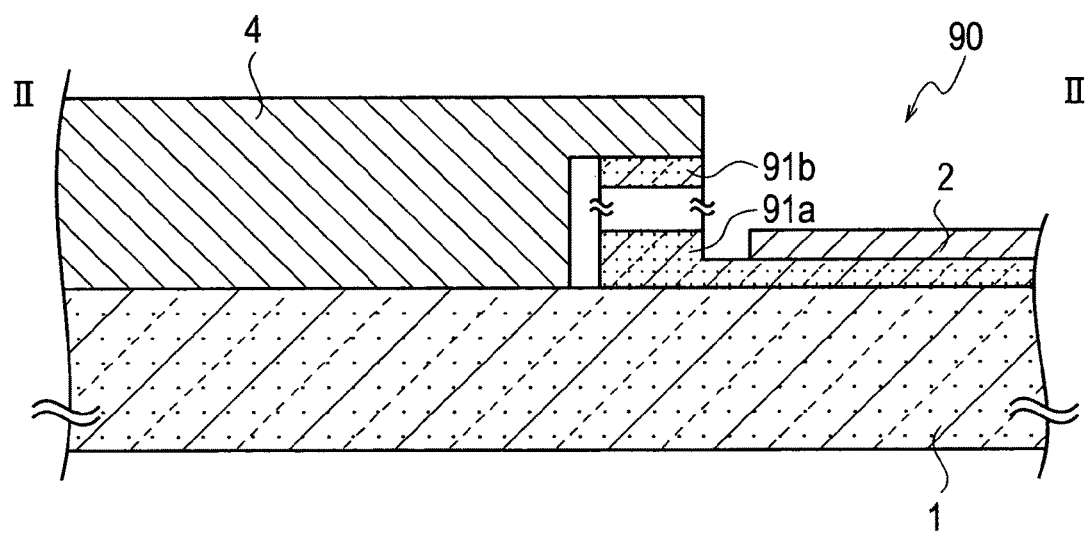
FIG. 5B is a schematic cross-sectional configuration chart taken in the line II-II of FIG. 3 in the terahertz oscillation device according to the first embodiment of the present invention.

In the terahertz oscillation device according to the first embodiment, a schematic cross-section structure taken in the line I-I of FIG. 3 is expressed as shown in FIG. 5A, and a schematic cross-section structure taken in the line II-II of FIG. 3 is expressed as shown in FIG. 5B.

The MIM reflector 50 is formed from the structure where the insulating layer 3 is made the inclusion between the first electrode 2 and the second electrode 4, as shown in FIG. 5A. Moreover, as clearly from FIG. 5B, the active element 90 composed of the RTD is placed on the semi insulating semiconductor substrate 1. The first electrode 2 is placed contacting on the surface which etched a part of n$^+$ GaInAs layer 91$a$ of the RTD. The second electrode 4 is placed contacting on an n$^+$ GaInAs layer 91$b$ of the RTD. Furthermore, the second electrode 4 is placed extending on the semi insulating semiconductor substrate 1.

Thus, since the second electrode 4 extends to be placed on the semi insulating semiconductor substrate 1, it does not short-circuit mutually, and a configuration which can apply predetermined DC bias voltage between the n$^+$ GaInAs layer 91$a$ and the n$^+$ GaInAs layer 91$b$ of the RTD is provided.

In addition, the DC power supply 15 is connected between the first electrode 2 and the second electrode 4, and a resistance (not shown) for preventing a parasitic oscillation is connected between the first electrode 2 and the second electrode 4.

(Resonant Tunneling Diode)

Figure 6:
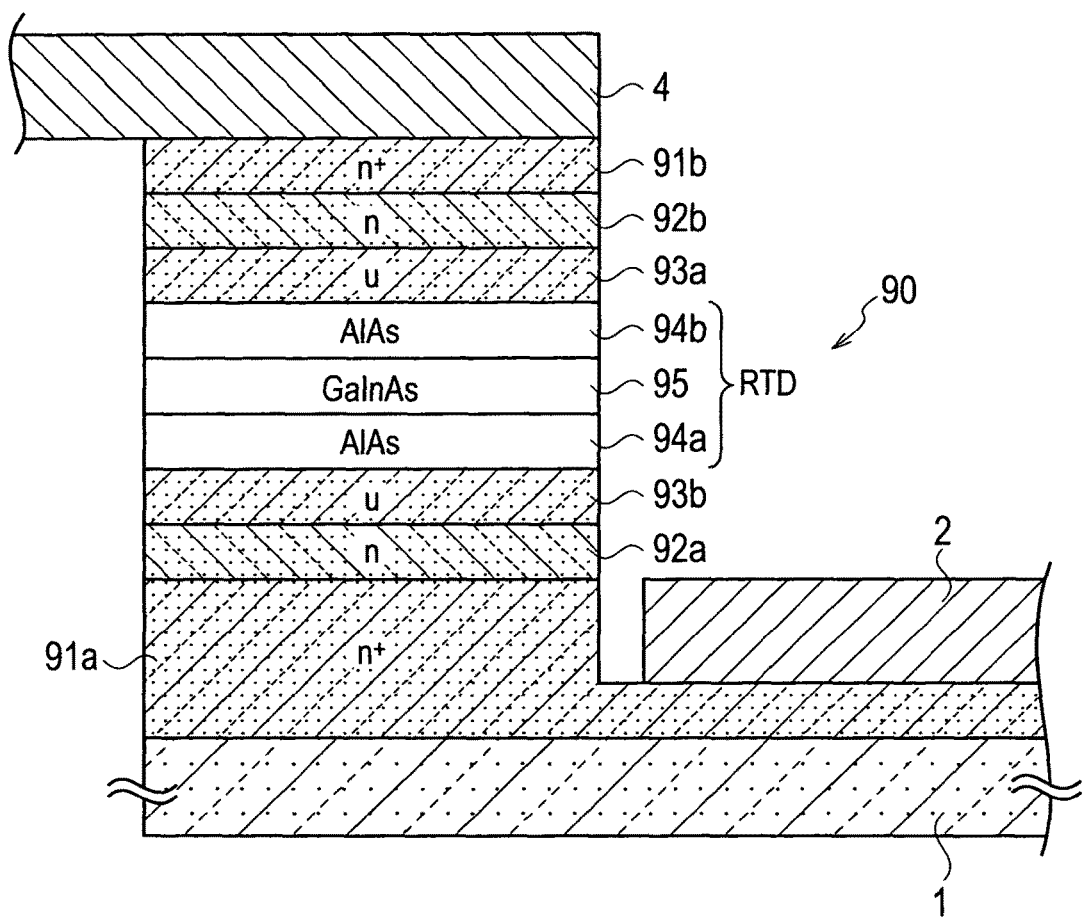
FIG. 6 is a schematic cross-sectional configuration chart of RTD (Resonant Tunneling Diode) used for the terahertz oscillation device according to the first embodiment of the present invention.
Figure 7:
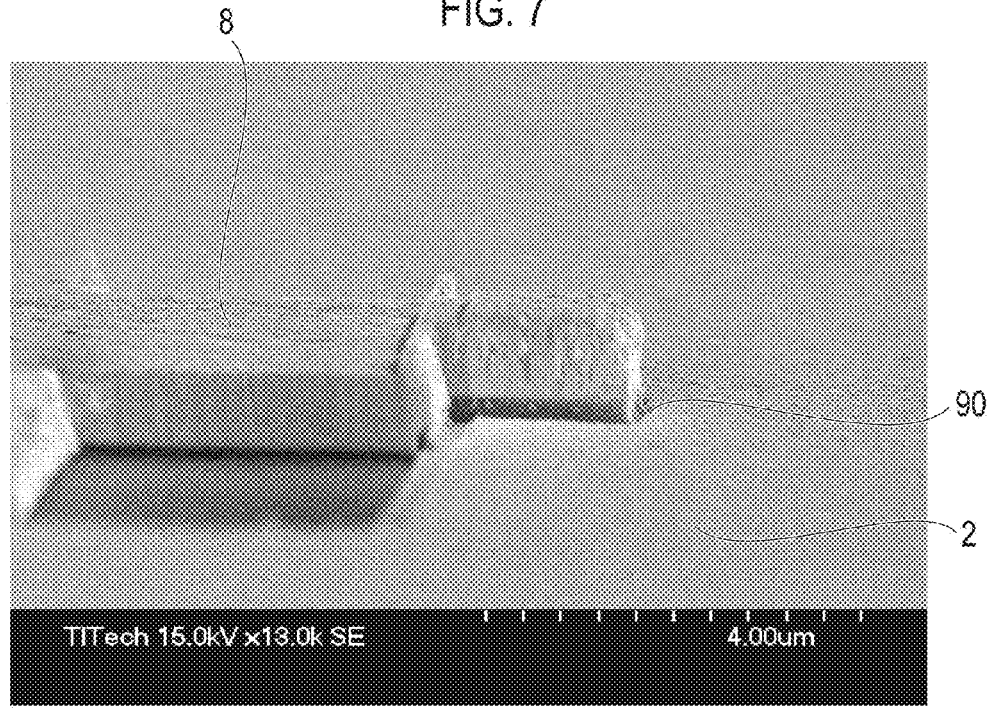
FIG. 7 shows an SEM photograph near the RTD (Resonant Tunneling Diode) used for the terahertz oscillation device according to the first embodiment of the present invention.

A schematic cross-section structure of the active element 90 used for the terahertz oscillation device according to the first embodiment is expressed as shown in FIG. 6. Moreover, an SEM photograph near the active element 90 is expressed as shown in FIG. 7.

As shown in FIG. 6, a configuration example of the RTD as the active element 90 used for the terahertz oscillation device according to the first embodiment includes: a GaInAs layer 91$a$ which is placed on the semiconductor substrate 1 composed of a semi insulating InP substrate, and is doped by high concentration in the n type impurity; a GaInAs layer 92$a$ which is placed on the GaInAs layer 91$a$ and is doped by the n type impurity; an undoped GaInAs layer 93$b$ placed on the GaInAs layer 92$a$; the RTD composed of AlAs layer 94$a$/GaInAs layer 95/AlAs layer 94$b$ placed on the GaInAs layer 93$b$; an undoped GaInAs layer 93$a$ placed on the AlAs layer 94$b$; a GaInAs layer 92$b$ which is placed on the GaInAs layer 93$a$ and is doped by the n type impurity; a GaInAs layer 91$b$ which is placed on the GaInAs layer 92$b$ and is doped by high concentration in the n type impurity; the second electrode 4 placed on the GaInAs layer 91$b$; and the first electrode 2 placed on the surface where the GaInAs layer 91$a$ is etched.

As shown in FIG. 6, as for the RTD, the AlAs layers 94$a$ and 94$b$ are formed by sandwiching the GaInAs layer 95. The RTD laminated in this way has the structure connected ohmic contacting to the first electrode 2 located in the lower side and the second electrode 4 located in the upper side via the n type GaInAs layers 92$a$ and 92$b$ and the n$^+$ type GaInAs layers 91$a$ and 91$b$, making inclusion of the undoped GaInAs layers 93$a$ and 93$b$ used as a spacer.

In this case, the thickness of each layer is as follows, for example.

The thickness of the n$^+$ type GaInAs layers 91$a$ and 91$b$ is about 400 nm and about 30 nm, respectively. The thickness of the n type GaInAs layers 91$a$ and 91$b$ is substantially equal, and is about 50 nm, for example. The thickness of the undoped GaInAs layers 93$a$ and 93$b$ is substantially equal, and is about 5 nm, for example. The thickness of the AlAs layers 94a and 94b is equal, and is about 1.5 nm, for example. The thickness of the GaInAs layer 95 is about 4.5 nm, for example.

In addition, an SiO$_2$ film, an Si$_3$N$_4$ film, an SiON film, an HfO$_2$ film, an Al$_2$O$_3$ film, etc., or the insulating film composed of these multilayer films can also be deposited on the sidewall part of the layered structure shown in FIG. 6. The insulating layer can be formed by CVD or spattering technique.

(Electrode Pattern Configuration and Electromagnetic Field Simulation Result)

Figure 8:
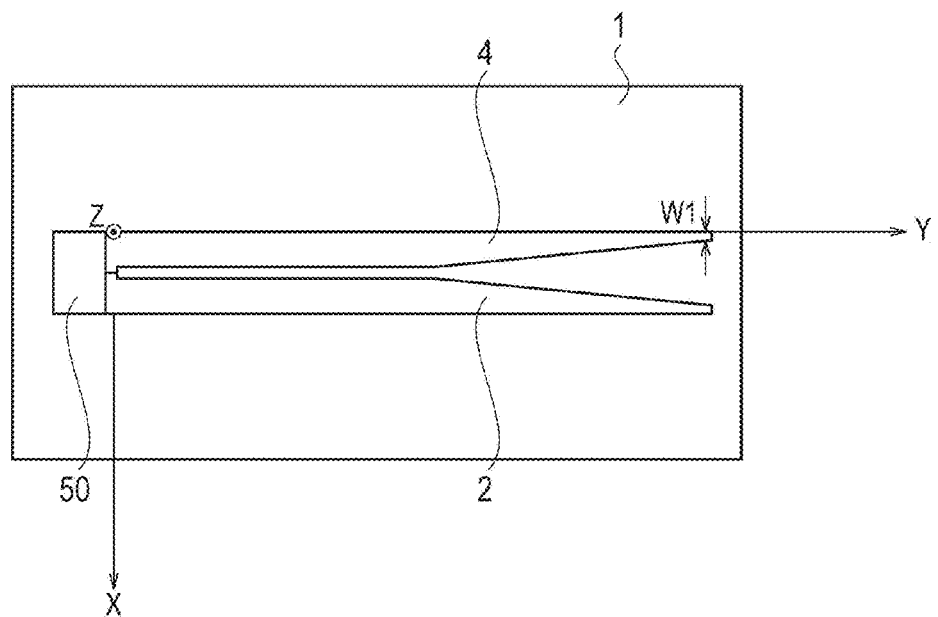
FIG. 8 shows an electrode pattern configuration example 1 for applying an electromagnetic field simulation of the terahertz oscillation device according to the first embodiment of the present invention.
Figure 9:
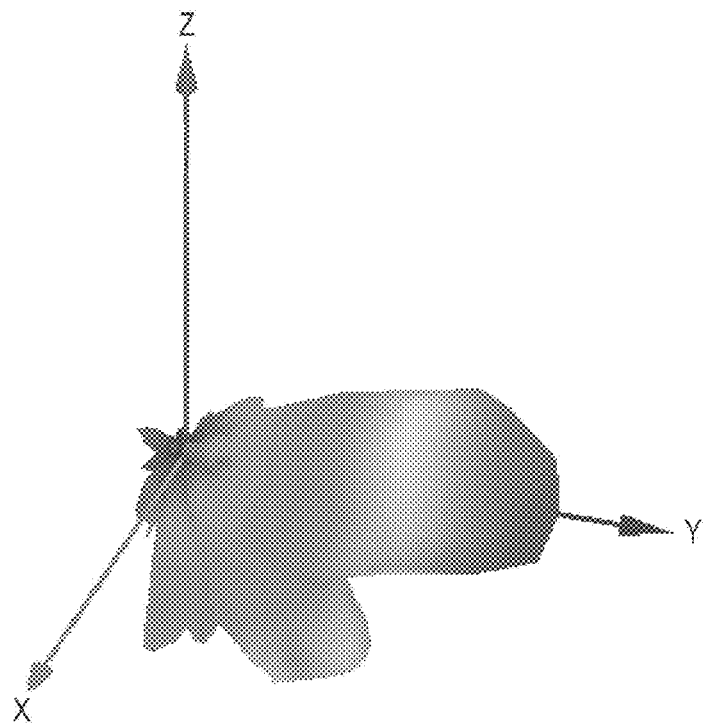
FIG. 9 shows an electromagnetic field simulation result of the electrode pattern configuration example 1 shown in FIG. 8.
Figure 10:
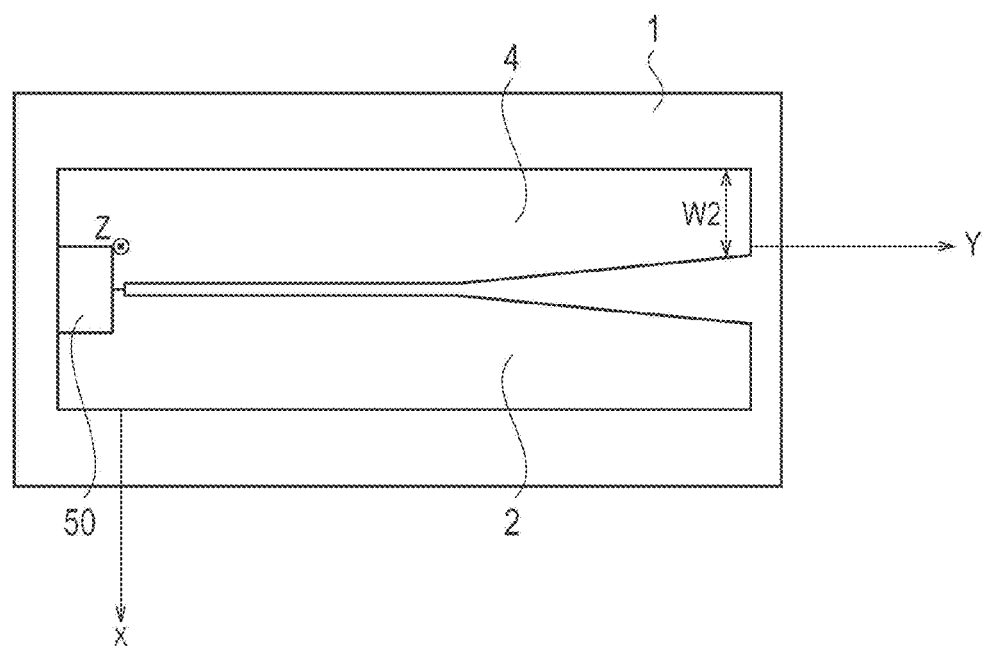
FIG. 10 shows an electrode pattern configuration example 2 for applying the electromagnetic field simulation of the terahertz oscillation device according to the first embodiment of the present invention.
Figure 11:
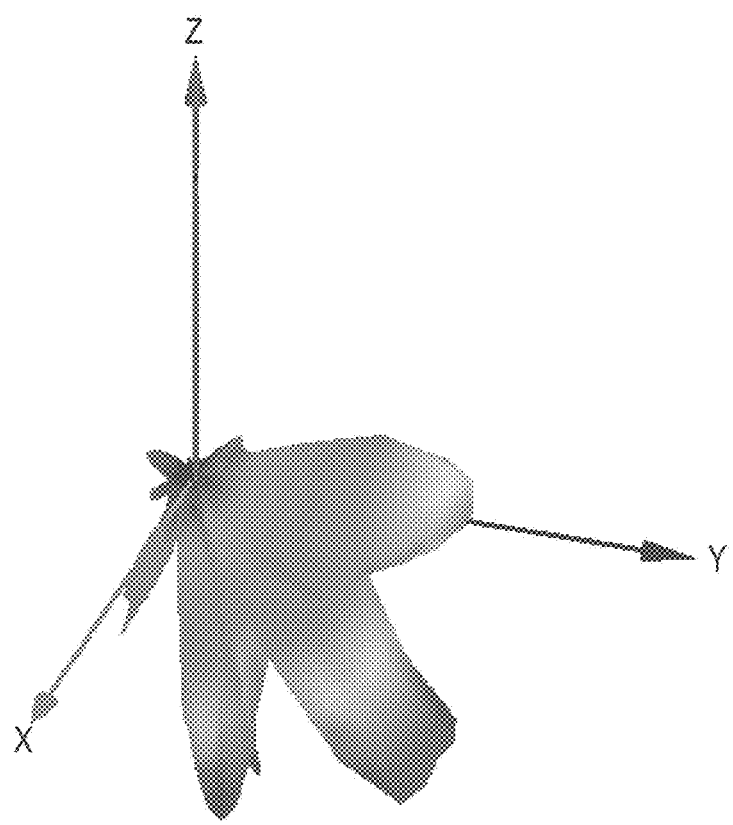
FIG. 11 shows an electromagnetic field simulation result of the electrode pattern configuration example 2 shown in FIG. 10.
Figure 12:
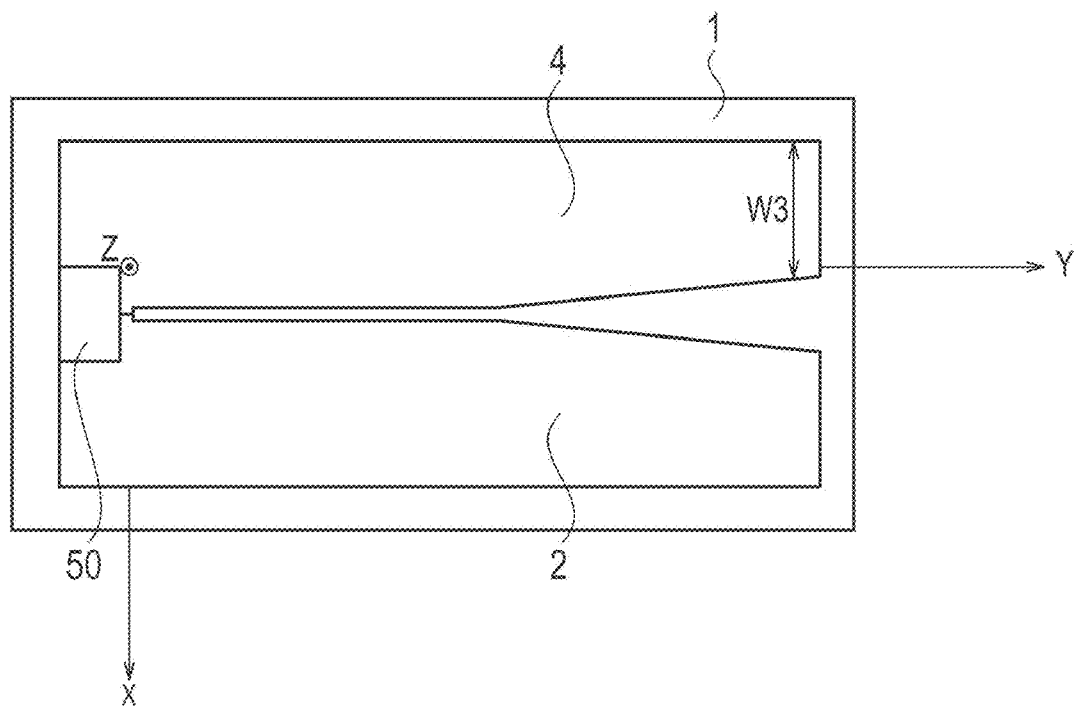
FIG. 12 shows an electrode pattern configuration example 3 for applying the electromagnetic field simulation of the terahertz oscillation device according to the first embodiment of the present invention.
Figure 13:
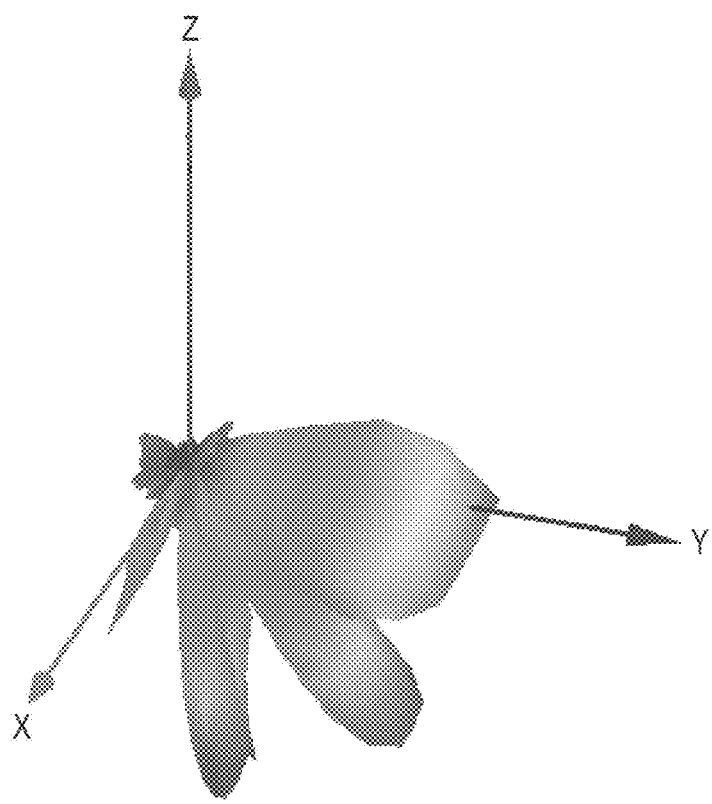
FIG. 13 shows an electromagnetic field simulation result of the electrode pattern configuration example 3 shown in FIG. 12.

An electrode pattern configuration example 1 which applies an electromagnetic field simulation of the terahertz oscillation device according to the first embodiment is expressed as shown in FIG. 8. In the electrode pattern configuration example 1 shown in FIG. 8, a three-dimensional electromagnetic field simulation result in the displayed XYZ axial direction is expressed as shown in FIG. 9. Similarly, an electrode pattern configuration example 2 which applies the electromagnetic field simulation of the terahertz oscillation device according to the first embodiment is expressed as shown in FIG. 10. In the electrode pattern configuration example 2 shown in FIG. 10, a three-dimensional electromagnetic field simulation result in the XYZ axial direction is expressed as shown in FIG. 11. Similarly, an electrode pattern configuration example 3 which applies the electromagnetic field simulation of the terahertz oscillation device according to the first embodiment is expressed as shown in FIG. 12. In the electrode pattern configuration example 3 shown in FIG. 12, a three-dimensional electromagnetic field simulation result in the XYZ axial direction is expressed as shown in FIG. 13.

The configuration examples 1 to 3 correspond to a structure where the width between the first electrode 2 and the second electrode 4 which compose the terahertz oscillation device is changed. Examples which set the width between the first electrode 2 and the second electrode 4 in the end part of the horn apertural area 80 to W1 by the configuration example 1, set it to W2 by the configuration example 2, and set it to W3 by the configuration example 3 is shown, respectively. The relation of the width between the first electrode 2 and the second electrode 4 is W1<W2<W3. As clearly from each electromagnetic field simulation result of the configuration examples 1 to 3, the directivity to the Y axial direction which is the oscillation direction of desired electromagnetic wave can be improved by narrowing the width between the first electrode 2 and the second electrode 4. On the other hand, the directivity to Y axial direction reduces and the tendency for the electromagnetic field radiating pattern intensity to −Z axial direction to increase appears as to enlarge with W1<W2<W3, on the relation of the width between the first electrode 2 and the second electrode 4. In addition, the width between each electrode of the configuration examples 1 to 3, the size of the horn apertural area, and the size of the waveguide can be suitably set up according to the oscillation frequency of electromagnetic wave.

(Oscillation Spectrum)

Figure 14:
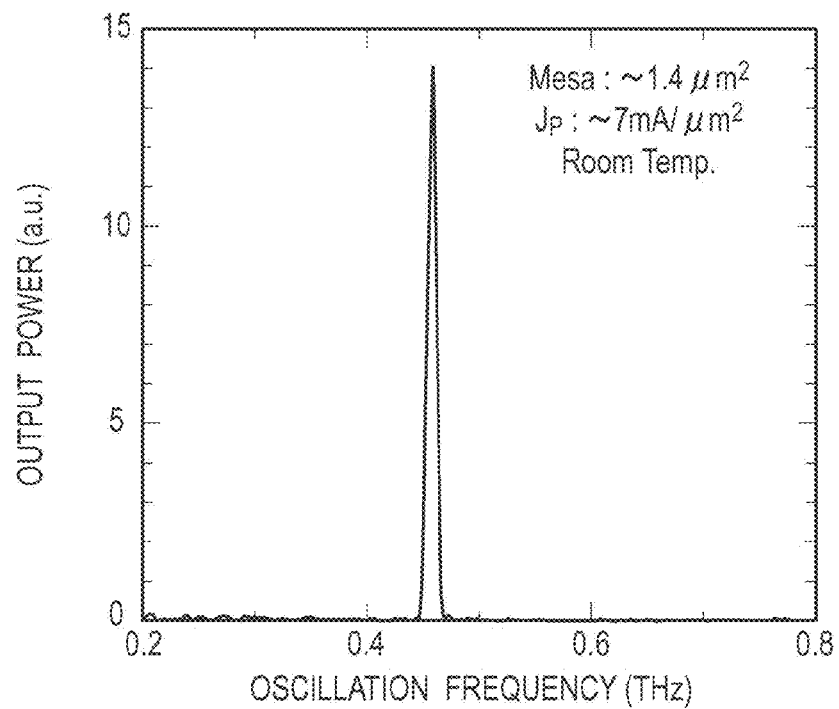
FIG. 14 shows an example of characteristics of an oscillation spectrum of the terahertz oscillation device according to the first embodiment of the present invention.

An example of characteristics of the oscillation spectrum of the terahertz oscillation device according to the first embodiment is expressed as shown in FIG. 14. In FIG. 14, the vertical axis expresses output power (a. u.), and the horizontal axis expresses oscillation frequency. The size of the RTD which composes the active element 90 is not more than about 1.4 µm$^2$. The oscillation frequency observed at room temperature is about 460 GHz. The current density Jp of the terahertz oscillation device at the time of the oscillation is about 7 mA/µm$^2$.

Figure 15A:
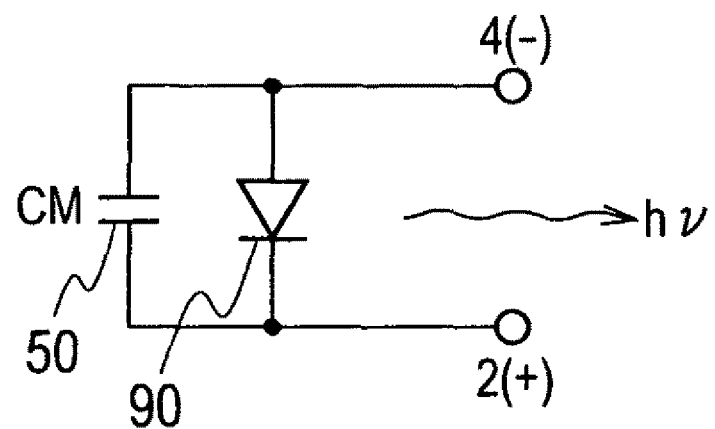
FIG. 15A is a schematic circuit configuration chart of the terahertz oscillation device according to the first embodiment of the present invention.

The schematic circuit configuration of the terahertz oscillation device related to a first embodiment is expressed by the parallel circuit of a diode which composes the active element 90, and capacitor CM which composes the MIM reflector 50, as shown in FIG. 15A. A cathode of the diode is connected to the first electrode 2, an anode of the diode is connected to the second electrode 4, the voltage of plus is applied to the first electrode 2, and the voltage of minus is applied to the second electrode 4. In an oscillation state, the electromagnetic wave (hv) spread with sufficient directivity to the Y axial direction which is the aperture opening direction of the horn apertural area.

Figure 15B:
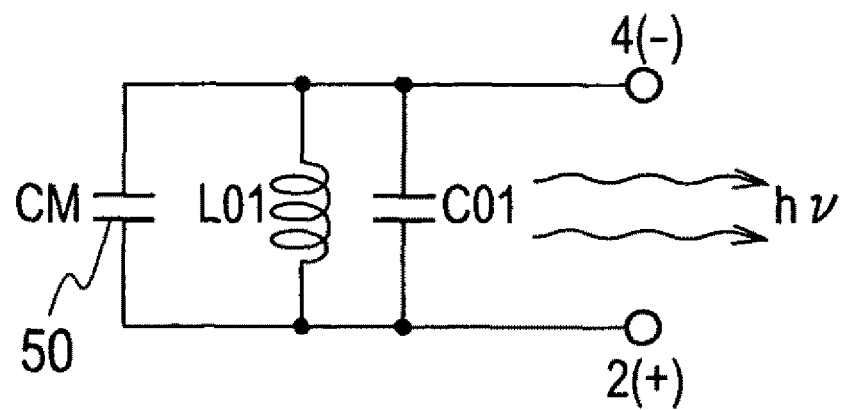
FIG. 15B is an equivalent circuit configuration diagram of the terahertz oscillation device according to the first embodiment of the present invention.

An equivalent circuit configuration of the terahertz oscillation device according to the first embodiment corresponding to FIG. 15A is expressed as shown in FIG. 15B. As shown in FIG. 15B, the RTD which composes the active element 90 can be expressed in the parallel circuit of the capacitor C01 and the inductor L01, and the oscillation frequency f of the terahertz electromagnetic wave (hv) is expressed by $f=1/[2\pi(L01(C01+CM))^{1/2}]$ since the capacitor CM of the MIM reflector 50 is connected still in parallel.

Modified Example

An electrode pattern structure of a terahertz oscillation device according to a modified example 1 of the first embodiment is schematically expressed as shown in FIG. 16A, and an electrode pattern structure of a terahertz oscillation device according to a modified example 2 is schematically expressed as shown in FIG. 16B.

The electrode pattern structure of the terahertz oscillation device according to the modified example 1 is an example which provides with stub structure at the second electrode 4 which composes the MIM reflector 50, and the electrode pattern structure of the terahertz oscillation device according to the modified example 2 is an example which provides with stub structure at the first electrode 2 which composes the MIM reflector 50.

That is, as shown in FIG. 16A, the second electrode may be provided with a plurality of stubs 13A in the part which composes the MIM reflector 50.

Moreover, as shown in FIG. 16B, the first electrode may be provided with a plurality of stubs 13B in the part which composes the MIM reflector.

A plurality of stubs 13A or 13B may be placed at equal intervals so that the resonator 60 may be faced, or may be placed so that this interval may be changed.

Both the first electrode 2 and the second electrode 4 may be provided with a plurality of stubs by combining the above-mentioned modified example 1 and modified example 2.

It proves that a resonant circuit is formed by providing the stub of the length of a quarter-wavelength of the electromagnetic wave in a part of the transmission line of electromagnetic wave, pulling the electromagnetic wave into this stub, and returning to the transmission line by reflecting it. This is a phenomenon in which the leakage from the transmission line of the electromagnetic wave decreases since only the electromagnetic wave having the wavelength of 4 times of the length of the stub among the electromagnetic wave which entered into the transmission line is short-circuited equivalent in the position of the stub, and the aforementioned electromagnetic wave is reflected by this way. According to this method, since it is decided toward the wavelength of the inputted electromagnetic wave that the length of the stub is the quarter-wavelength, although it can resonate strongly and can be made to reflect toward the electromagnetic wave from which the wavelength of the electromagnetic wave is 4 times of the length of the stub, there are few this reflection effects about the electromagnetic wave with wide bandwidth.

The length of the stub 13A of the modified example 1 of the first embodiment is made into the length which shifted from a quarter-wavelength, without making as a quarter-wavelength of the electromagnetic wave of the central part of the incident electromagnetic wave with the band. For example, when there is a frequency range which should be reflected, it is possible to reflect the electromagnetic wave of the frequency range which should be reflected in the wide range by providing many stubs 13A having a length of two to three or more of the wavelength for performing partial reflection of the electromagnetic wave having the frequency of the central value of this frequency range.

Of course, although the reflection factor of electromagnetic wave is small as compared with the case of the quarter-wavelength, considerable reflection occurs as compared with the case where there is no stub. And it is effective in reflecting only worth with a loose resonance condition uniformly toward the frequency with a certain band (electromagnetic wave with the width of a certain wavelength). Moreover, the interference (Bragg reflection) which reinforces during the reflection from each stub occurs by performing to the length about a half of wavelength toward the electromagnetic wave having the frequency of the central value of the frequency range of the electromagnetic wave which should be reflected, the reflected wave superimposes each other, and the interval of the multi stage stub becomes a great value whose reflection factor is about 100%. The frequency range to reflection and the central value of the frequency are synthetically determined according to the length, the number, and the interval of the stub.

If the central wavelength of the electromagnetic wave having predetermined bandwidth is set to $\lambda_0$ and the interval of the stub is set to $\lambda_0/2$, the wavelength range $\Delta\lambda$ of the electromagnetic wave with the reflection factor near 100% can be obtained. At this time, the length of the stub is effective to design not less than $2\lambda_0$ to $3\lambda_0$. When the width of the stub is a half of the interval of the stub, it becomes a great reflection factor near 100% by the small number whose number of stubs is about 5 to 10 pieces. When the width of the stub is other than this, in order to obtain a great reflection factor, it is necessary to increase the number of stubs, and a frequency range also becomes narrow. However, such the length is not limited and is prescribed in design by the relation with the bandwidth to reflect.

In addition, in the modified example 1 of the first embodiment, the leakage electromagnetic wave transmitted to the closed unit side is reflected by the stub 13A and the MIM reflector, and is returned to the aperture side. Then, since the reflected electromagnetic wave is emitted as an output, the electromagnetic wave oscillated from the active element 90 becomes high power.

Since the operation of the stub 13B is the same as that of the stub 13A also in the modified example 2 of the first embodiment, the duplicating explanation is omitted.

In addition, an equivalent large amount of reflection factor can be obtained with the number of stubs of an abbreviation half compared with case of only one side, by providing the stub of multi stages in the electrode of both sides. Moreover, since the flexibility of the design at the time of deciding the frequency range and the central frequency can be raised, it is very effective on the design. In addition, the length of the stub attached to the both sides of the first electrode 2 and the second electrode 4, the number and the interval do not necessarily need to be equal, and can be changed into design on freedom.

According to the terahertz oscillation device according to the first embodiment, the electromagnetic wave of the frequency band with the comparatively wide bandwidth oscillated from the oscillation device of the frequency variable can be oscillated in the horizontal direction to the substrate to a high-efficiency and high power over the oscillation frequency whole region, and it is also easy to be integrated.

According to the terahertz oscillation device according to the first embodiment of the present invention, the electromagnetic wave can be efficiently emitted in the direction horizontal to the substrate by not only giving the apertural area, but giving the waveguide and the horn apertural area.

According to the terahertz oscillation device according to the modified example of the first embodiment, the electromagnetic wave of the frequency band with the comparatively wide bandwidth oscillated from the oscillation device of the frequency variable can be oscillated in the horizontal direction to the substrate at still more high-efficiency and still more high power over the oscillation frequency whole region, and it is also easy to be integrated, by combining the stub structure with the electrode which composes the MIM reflector.

According to the terahertz oscillation device related to the modified example of the first embodiment, the electromagnetic wave can be emitted still more efficiently in the direction horizontal to the substrate by combining the stub structure with the electrode which composes the MIM reflector.

Second Embodiment

Figure 17:
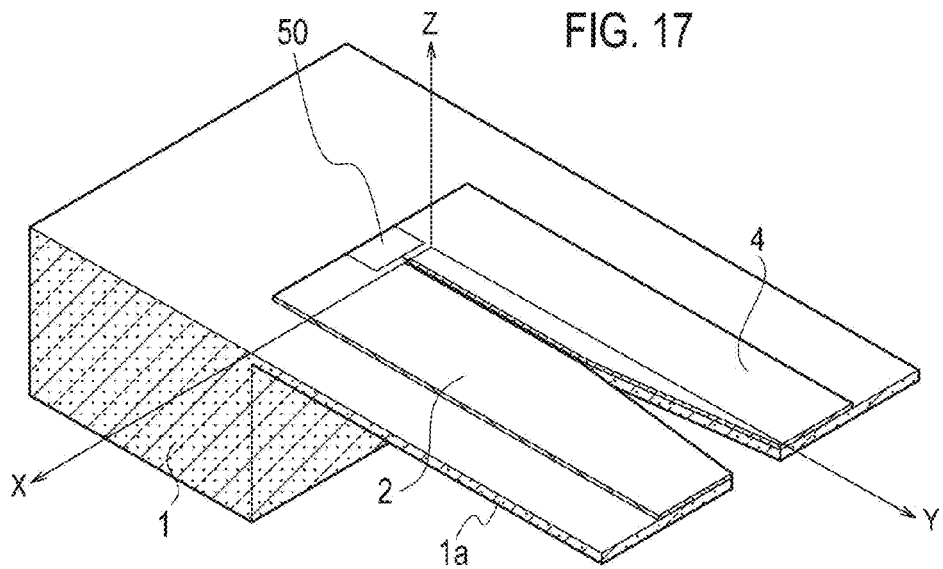
FIG. 17 is a schematic bird's-eye view of a terahertz oscillation device according to a second embodiment of the present invention.

A schematic bird's-eye view of a terahertz oscillation device according to a second embodiment is expressed as shown in FIG. 17.

In the second embodiment, as shown in FIG. 17, the semiconductor substrate 1 is thin-layered in a region to which the first electrode 2 and the second electrode 4 forming the resonator 60, the waveguide 70, and the horn apertural area 80 are placed. Furthermore, as shown in FIG. 17, a semiconductor substrate 1a of the waveguide 70 and the horn apertural area 80 between the first electrode 2 and the second electrode 4 may be removed completely. Since other configurations are the same as that of the first embodiment, the explanation of each part is omitted.

In FIG. 17, the thickness of the thin-layered semiconductor substrate 1a is about 20 μm, for example. Moreover, the length of the waveguide 70 is not more than about 700 μm, for example, and the length of the horn apertural area 80 is also not more than about 700 μm. The length of the whole terahertz oscillation device according to the second embodiment including the MIM reflector 50 is not more than about 1600 μm, for example.

Moreover, the angular aperture of the horn apertural area 80 is not more than about 10 degrees, for example.

Figure 18:
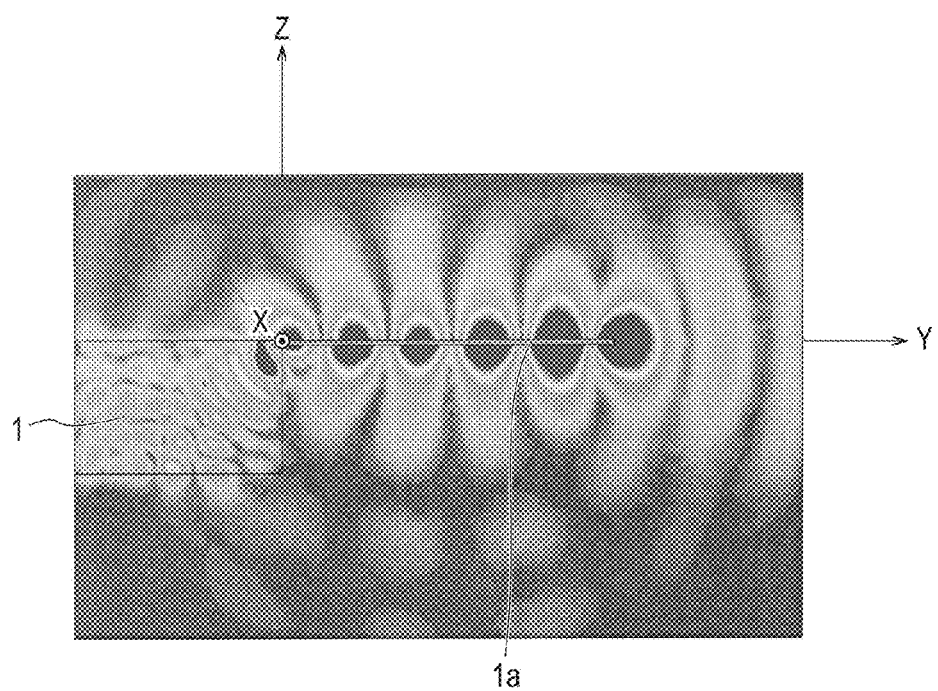
FIG. 18 shows a simulation result of a field pattern on the Y-Z plane of the terahertz oscillation device according to the second embodiment shown in FIG. 17.
Figure 19:
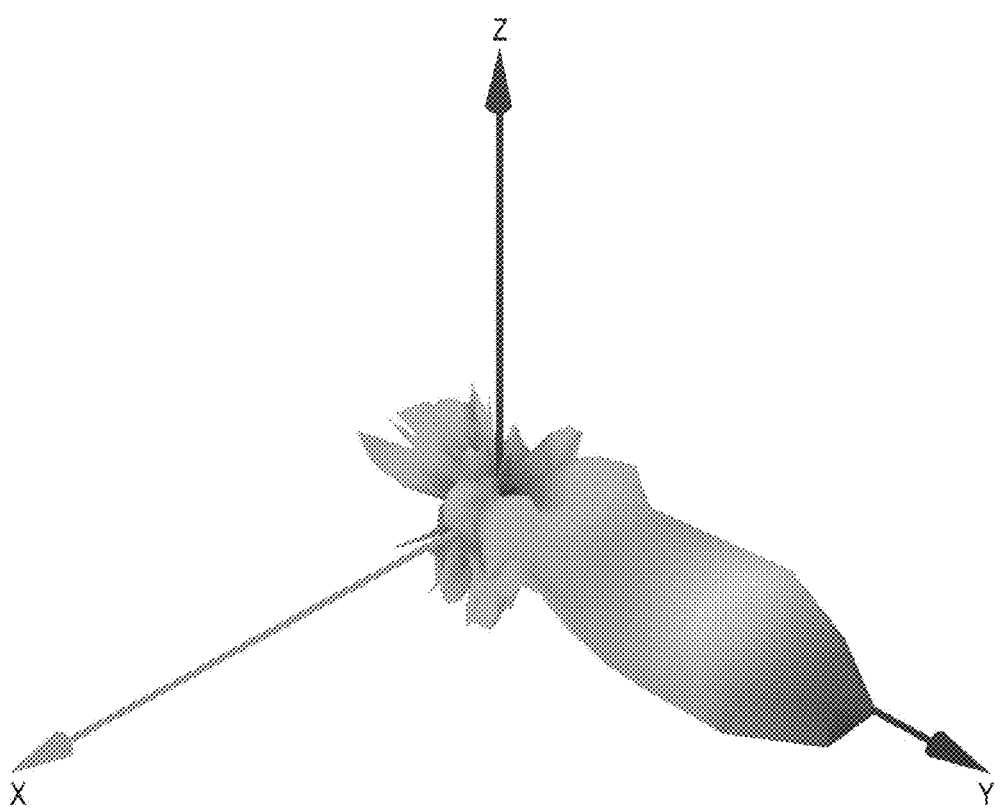
FIG. 19 shows an electromagnetic field simulation result of the terahertz oscillation device according to the second embodiment shown in FIG. 17.

A simulation result of the field pattern on the Y-Z plane of the terahertz oscillation device according to the second embodiment shown in FIG. 17 is expressed as shown in FIG. 18. Moreover, a three-dimensional electromagnetic field simulation result in the XYZ axial direction of the terahertz oscillation device according to the second embodiment shown in FIG. 17 is expressed as shown in FIG. 19.

As shown in FIG. 18, according to the electromagnetic field simulation result of the terahertz oscillation device according to the second embodiment, the field pattern is generated at the fixed interval in the Y axial direction along with the electrode pattern extended to the Y axial direction on the thin-layered semiconductor substrate 1a, and there is almost no leakage of the electric field of the vertical direction to the semiconductor substrate 1a (−Z axial direction). Moreover, according to the three-dimensional electromagnetic field simulation result in the XYZ axial direction, as shown in FIG. 19, it proves that the directivity of the Y axial direction becomes remarkably satisfactory.

Figure 20A:
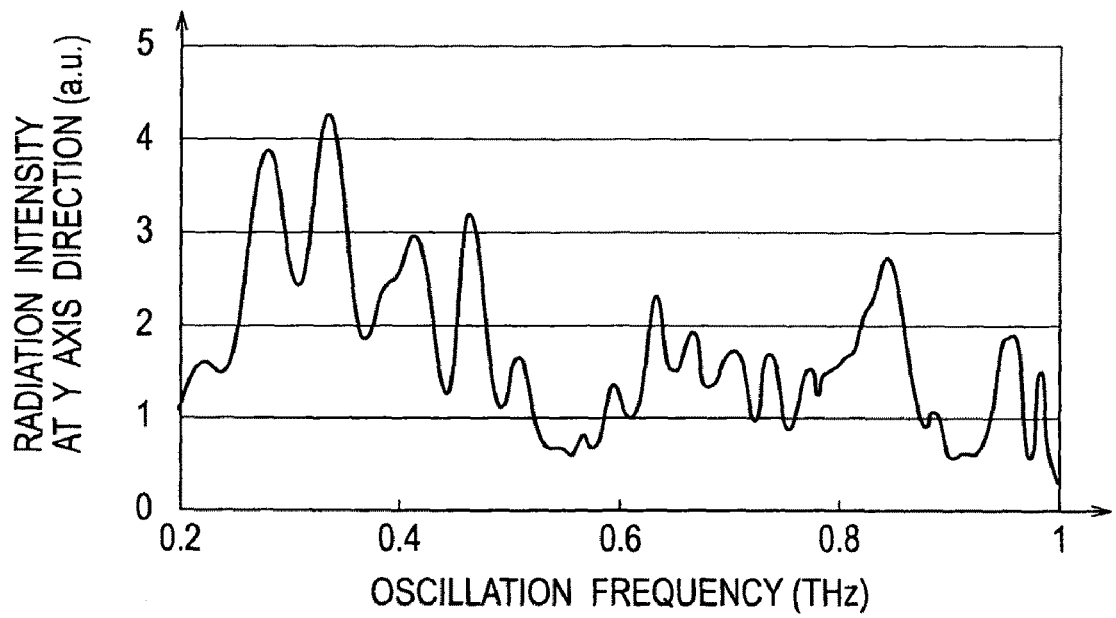
FIG. 20A is a figure showing the relation between radiation intensity at Y axial direction and oscillation frequency of the terahertz oscillation device according to the first embodiment shown in FIG. 3.
Figure 20B:
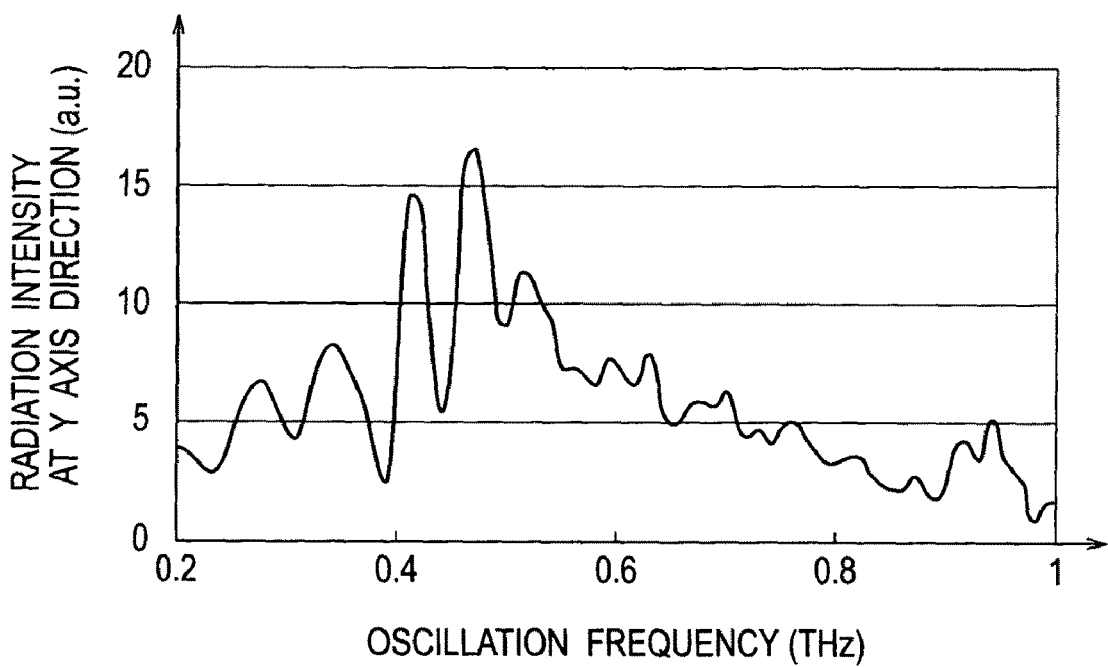
FIG. 20B is a figure showing the relation between radiation intensity at Y axial direction and oscillation frequency of the terahertz oscillation device according to the second embodiment shown in FIG. 17.

The relation between the radiation intensity at Y axial direction (a. u.) and the oscillation frequency (THz) of the terahertz oscillation device according to the first embodiment shown in FIG. 3 is expressed as shown in FIG. 20A, and the relation between the radiation intensity at Y axial direction (a. u.) and the oscillation frequency (THz) of the terahertz oscillation device according to the second embodiment shown in FIG. 17 is expressed as shown in FIG. 20B. As clearly from FIG. 20A and FIG. 20B, in the terahertz oscillation device according to the second embodiment, the harmonics contents are suppressed and the directivity is improving. Moreover, the radiation intensity at Y axial direction (a. u.) is increasing. Moreover, in the terahertz oscillation device according to the second embodiment, the peak value of the radiation intensity at Y axial direction (a. u.) shifts to the higher oscillation frequency side. In this case, the radiation intensity at Y axial direction (a. u.) indicates the rate emitted to the Y axial direction as relative intensity on the radiating pattern among the electric power emitted from the antenna.

As for the technology for forming the above-mentioned thin-layered semiconductor substrate 1a, the formation technology of MEMS (Micro Electro Mechanical Systems) devices is applicable.

According to the terahertz oscillation device according to the second embodiment, it becomes possible by thin-layering the semiconductor substrate to inhibit the influence of the substrate, the directivity can be improved over the oscillation frequency whole region, the electromagnetic wave of the frequency band with the comparatively wide bandwidth oscillated from the oscillation device of the frequency variable can be oscillated in the horizontal direction to the substrate to the high-efficiency and the high power, and it is also easy to be integrated.

According to the terahertz oscillation device according to the second embodiment, it becomes possible to inhibit the influence of the substrate, and the directivity is improved in the direction horizontal to the substrate, and it becomes possible to emit the electromagnetic wave efficiently, by thin-layering the semiconductor substrate.

Third Embodiment

Figure 21:
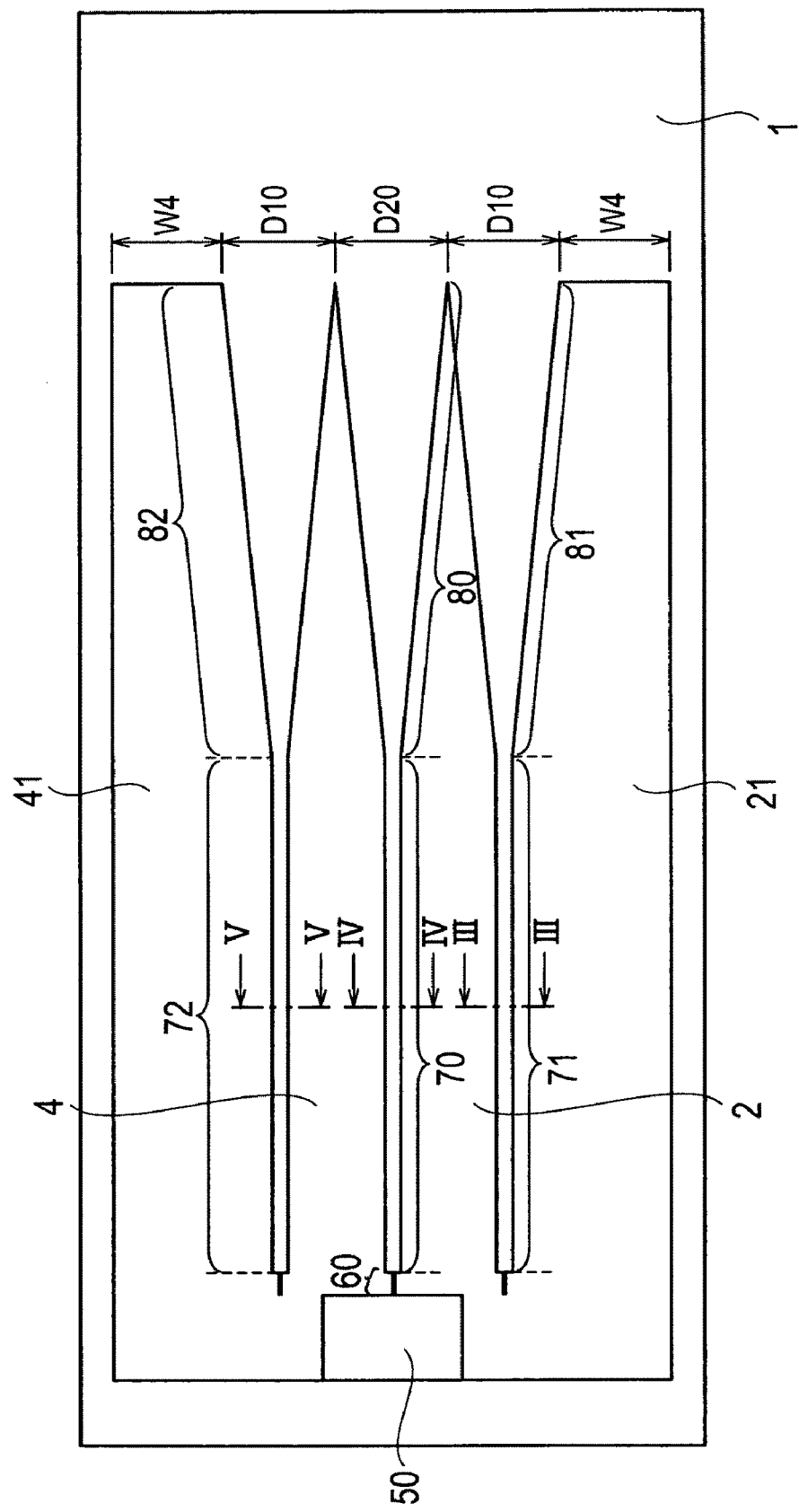
FIG. 21 is a schematic plan view of an electrode pattern structure of a terahertz oscillation device according to a third embodiment of the present invention.
Figure 22A:
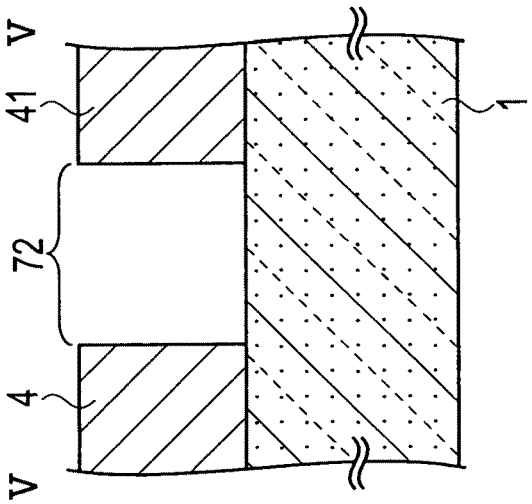
FIG. 22A is a schematic cross-sectional configuration chart taken in the line III-III of FIG. 21.
Figure 22B:
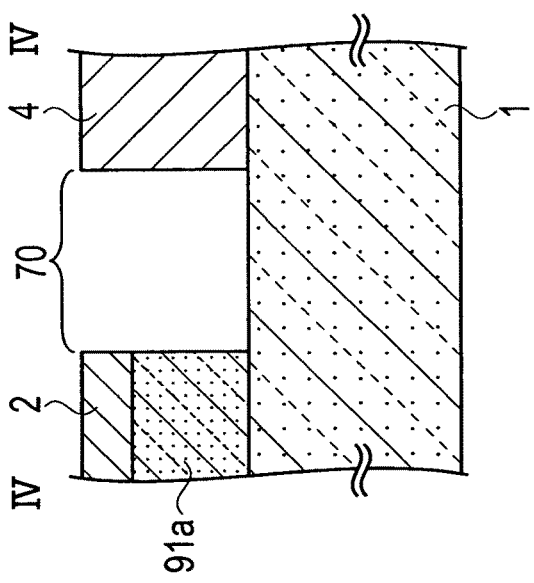
FIG. 22B is a schematic cross-sectional configuration chart taken in the line IV-IV of FIG. 21.
Figure 22C:
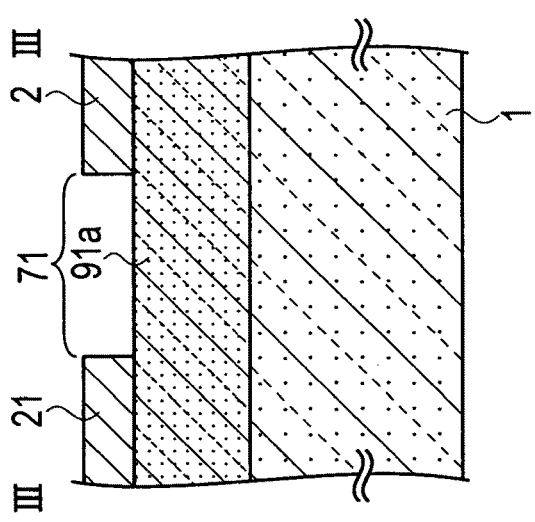
FIG. 22C is a schematic cross-sectional configuration chart taken in the line V-V of FIG. 21.

A schematic plane constitution of an electrode pattern structure of a terahertz oscillation device according to a third embodiment of the present invention is expressed as shown in FIG. 21. Moreover, a schematic cross-section structure taken in the line III-III of FIG. 21 is expressed as shown in FIG. 22A, a schematic cross-section structure taken in the line IV-IV of FIG. 21 is expressed as shown in FIG. 22B, and a schematic cross-section structure taken in the line V-V of FIG. 21 is expressed as shown in FIG. 22C.

Also in the terahertz oscillation device according to the third embodiment, since the configuration of the first electrode 2, the second electrode 4, the MIM reflector 50, the resonator 60, and the active element 90 is the same as that of the first embodiment shown in FIG. 3 to FIG. 6, the duplicate explanation is omitted hereinafter.

As shown in FIG. 21 and FIG. 22, the terahertz oscillation device according to the third embodiment includes a semiconductor substrate 1; a first electrode 2 placed on the semiconductor substrate 1; an insulating layer 3 (FIG. 3) placed on the first electrode 2; a second electrode 4 which is placed via the insulating layer 3 toward the first electrode 2, and opposes the first electrode 2 to be placed on the semiconductor substrate 1; a slot line electrode 21 which is adjoining of the first electrode 2 on the semiconductor substrate 1, and opposes the first electrode 2 to be placed in the opposite side of the second electrode 4; a slot line electrode 41 which is adjoining of the second electrode 4 on the semiconductor substrate 1, and opposes the second electrode 4 to be placed in the opposite side of the first electrode 2; a MIM reflector 50 formed between the first electrode 2 and the second electrode 4 by sandwiching the insulating layer 3; a resonator 60 which is adjoining of the MIM reflector 50 and is placed between the first electrode 2 and the second electrode 4 which oppose on the semiconductor substrate 1; an active element 90 placed at a substantially central part of the resonator 60; a waveguide 70 which is adjoining of the resonator 60 and is placed between the first electrode 2 and the second electrode 4 which oppose on the semiconductor substrate 1; a horn apertural area 80 which is adjoining of the waveguide 70 and is placed between the first electrode 2 and the second electrode 4 which oppose on the semiconductor substrate 1; a waveguide 71 placed between the first electrode 2 and the slot line electrode 21 which oppose on the semiconductor substrate 1; a horn apertural area 81 which is adjoining of the waveguide 71 and is placed between the first electrode 2 and the slot line electrode 21 which oppose on the semiconductor substrate 1; a waveguide 72 placed between the second electrode 4 and the slot line electrode 41 which oppose on the semiconductor substrate 1; and a horn apertural area 82 which opposes on the semiconductor substrate 1 to be placed between the second electrode 4 and the slot line electrode 41, and is adjoining of the waveguide 72.

As well as the first embodiment, although the RTD is typical as the active element 90, the active element 90 can compose also from the diodes and transistors except the RTD. As other active elements, a TUNNETT diode, an IMPATT diode, a GaAsFET, a GaN based FET, HEMT, and HBT, etc. are also applicable, for example.

The horn apertural areas 80 to 83 compose an aperture horn antenna.

In the terahertz oscillation device according to the third embodiment, as shown in FIG. 21, the width W4 of the slot line electrodes 21 and 41 in an output terminal is about 160 µm, for example. Moreover, as shown in FIG. 21, the width D20 of the horn apertural area 80, the width D10 of the horn apertural areas 81 and 82, and the width W4 of the slot line electrodes 21 and 41 in the output terminal can be suitably changed, so that it may describe later.

The waveguide 70 is placed at the apertural area of the resonator 60.

The MIM reflector 50 is placed at the closed unit of the opposite side of the apertural area of the resonator 60.

In a part which composes the MIM reflector 50, the first electrode 2 may be provided with a plurality of stubs as well as the modified example 1 of the first embodiment shown in FIG. 16A.

Similarly, in a part which composes the MIM reflector 50, the second electrode 4 may be provided with a plurality of stubs as well as the modified example 2 of the first embodiment shown in FIG. 16B.

Moreover, in the above configuration, a plurality of stubs may be placed at equal intervals facing to the resonator 60, and may be placed at variable intervals.

(Standing Wave Pattern)

Figure 23:
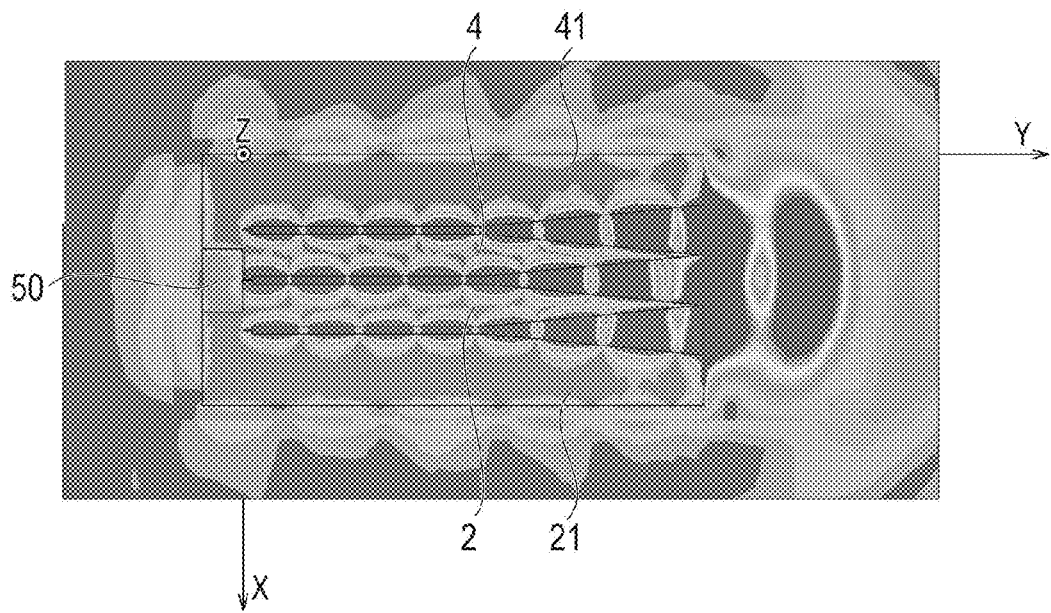
FIG. 23 shows a simulation result of a field pattern on the X-Y plane of the terahertz oscillation device according to the third embodiment shown in FIG. 21.

A simulation result of the field pattern on the X-Y plane of the terahertz oscillation device according to the third embodiment shown in FIG. 21 is expressed as shown in FIG. 23.

In the terahertz oscillation device according to the third embodiment, compared with the first to second embodiments, the directivity further improves by placing one pair of the slot line electrodes 21 and 41 of the tapered form which made the same shape on both the sides of the taper slot antenna composed of the first electrode 2 and the second electrode 4 connected to the active element 90.

According to the terahertz oscillation device related to a third embodiment, even if integrating the taper slot antenna on the semiconductor substrate 1, the influence of the semiconductor substrate 1 can be inhibited and sufficient directivity can be obtained by placing one pair of the slot line electrodes 21 and 41 of tapered form in parallel on both the sides of the taper slot antenna composed of the first electrode 2 and the second electrode 4.

The electric field spreading from the taper slot antenna composed of the first electrode 2 and the second electrode 4 of the central part is pulled in one pair of the slot line electrodes 21 and 41 provided in both sides, and is reflected in the end face of the slot line electrodes 21 and 41, and returns to the first electrode 2 and the second electrode 4 of the central part. At this time, the standing wave is formed in the first electrode 2 and the second electrode 4 of the central part, and the slot line electrodes 21 and 41, and the electromagnetic wave is emitted externally by the reflected electric field. When the radiation field from the first electrode 2 and the second electrode 4 of the central part, and one pair of slot line electrodes 21 and 41 interferes each other, the directivity improves.

Modified Example

Figure 24:
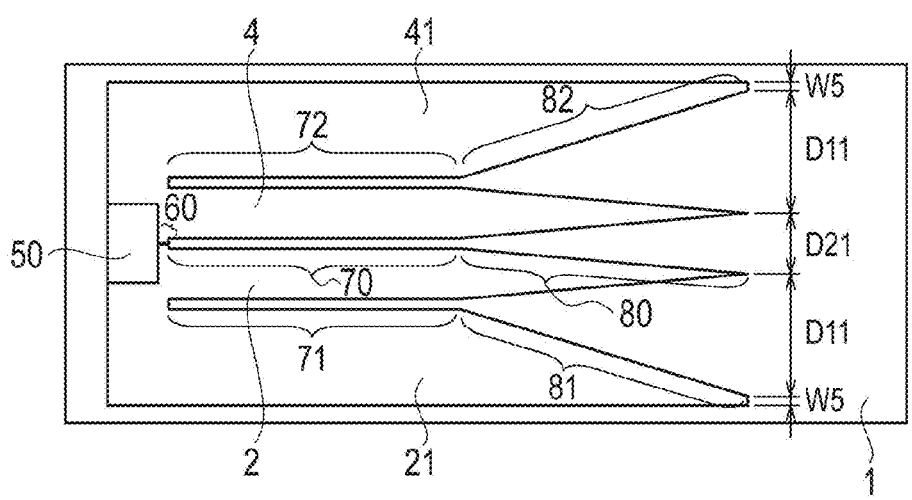
FIG. 24 is a schematic plan view of an electrode pattern structure of a terahertz oscillation device according to a modified example 1 of the third embodiment of the present invention.
Figure 25:
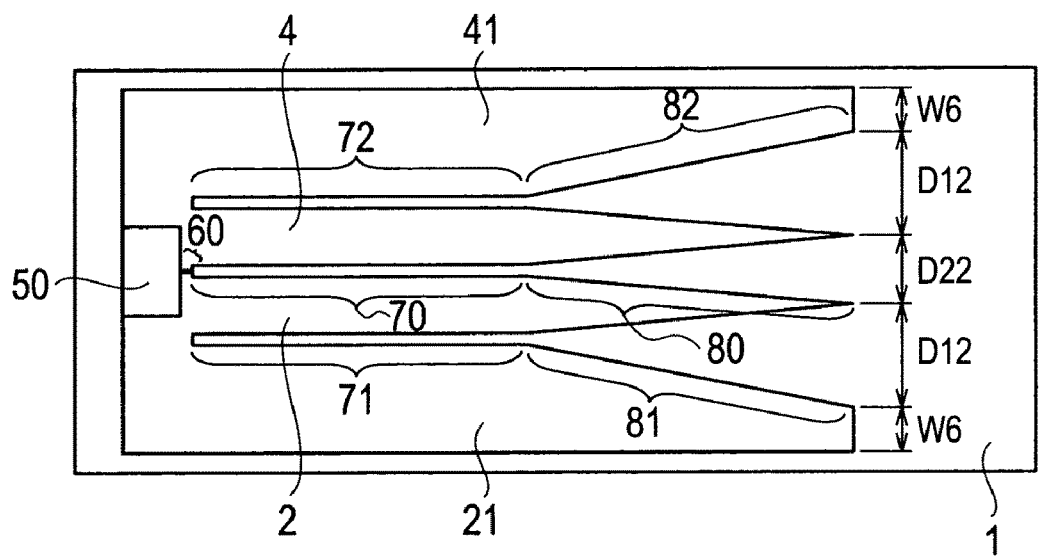
FIG. 25 is a schematic plan view of an electrode pattern structure of a terahertz oscillation device according to a modified example 2 of the third embodiment of the present invention.
Figure 26:
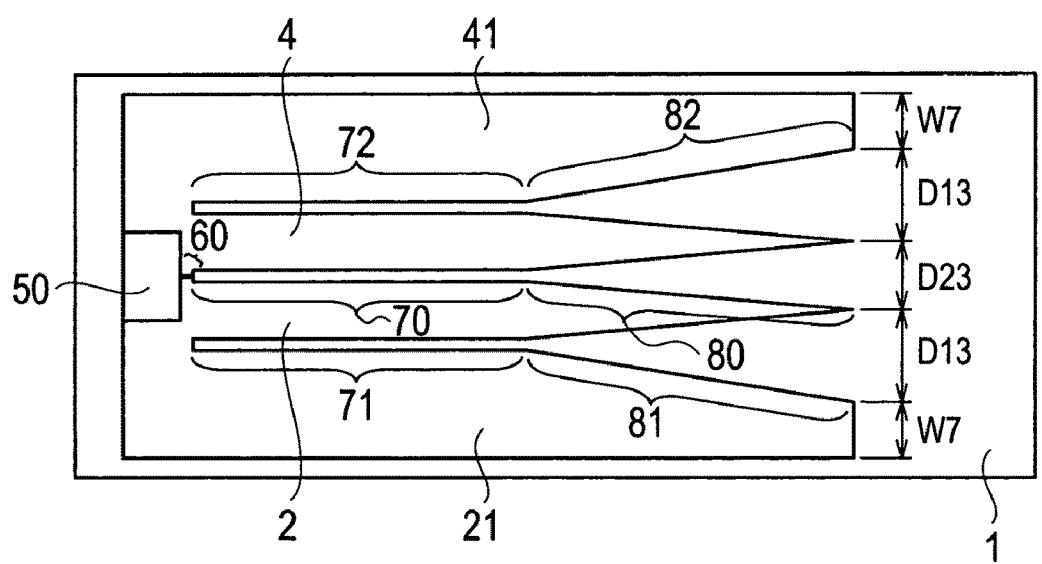
FIG. 26 is a schematic plan view of an electrode pattern structure of a terahertz oscillation device according to a modified example 3 of the third embodiment of the present invention.

An electrode pattern structure of a terahertz oscillation device according to a modified example 1 of the third embodiment is expressed as shown in FIG. 24, an electrode pattern structure of a terahertz oscillation device according to a modified example 2 of the third embodiment is expressed as shown in FIG. 25, and an electrode pattern structure of a terahertz oscillation device according to a modified example 3 of the third embodiment is expressed as shown in FIG. 26.

In FIG. 24, the width D21 of the horn apertural area 80 in the output terminal is about 160 μm, for example, and the width D11 of the horn apertural areas 81 and 82 is about 300 μm, for example. The width W5 of the slot line electrodes 21 and 41 can be changed suitably.

In FIG. 25, the width D22 of the horn apertural area 80 in the output terminal is about 160 μm, for example, and the width D12 of the horn apertural areas 81 and 82 is about 220 μm, for example. The width W6 of the slot line electrodes 21 and 41 can be changed suitably.

In FIG. 26, the width D23 of the horn apertural area 80 in the output terminal is about 160 μm, for example, and the width D13 of the horn apertural areas 81 and 82 is about 200 μm, for example. The width W7 of the slot line electrodes 21 and 41 can be changed suitably.

Figure 27:
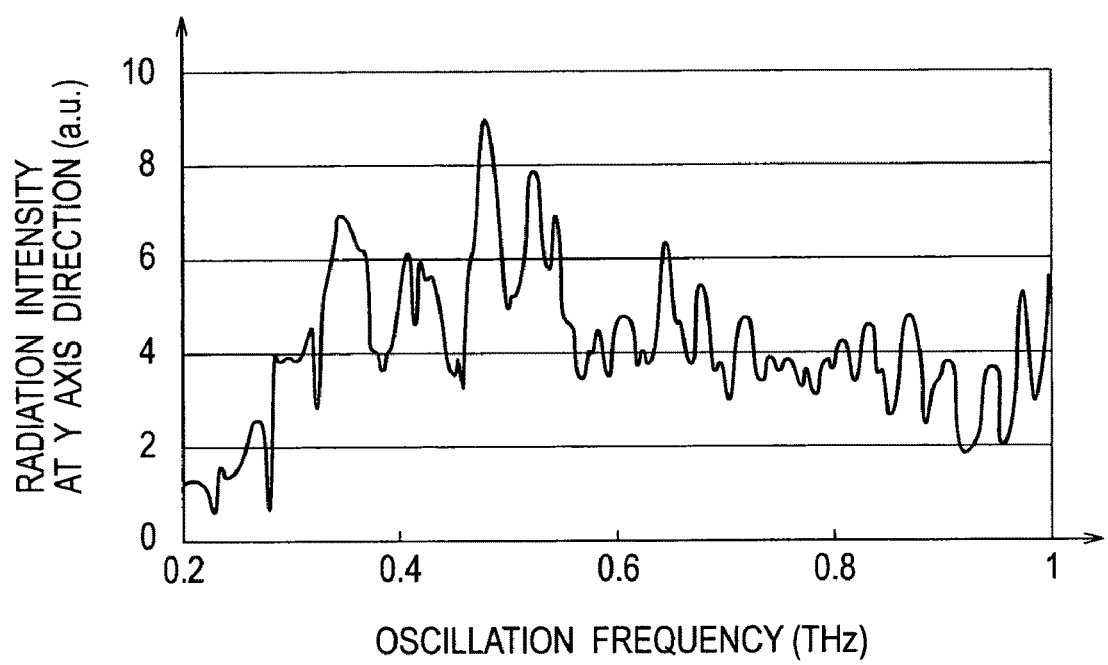
FIG. 27 is a figure showing the relation between radiation intensity at Y axial direction and oscillation frequency of the terahertz oscillation device according to the third embodiment shown in FIG. 21.

The relation between the radiation intensity at Y axial direction (a. u.) and the oscillation frequency (THz) of the terahertz oscillation device according to the third embodiment is expressed as shown in FIG. 27. As clearly from FIG. 27, the electromagnetic wave of the frequency band with the comparatively wide bandwidth oscillated from the oscillation device of the frequency variable can be oscillated in the horizontal direction to the substrate at the high-efficiency and the high power over the oscillation frequency whole region. Moreover, it is easy to be integrated.

(Electrode Pattern Configuration and Electromagnetic Field Simulation Result)

Figure 28A:
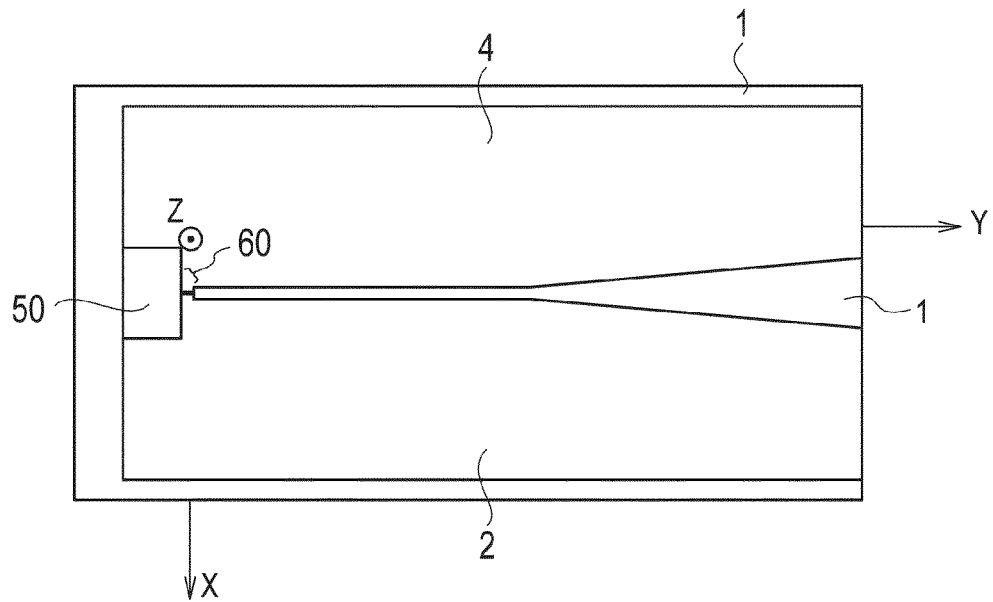
FIG. 28A shows an electrode pattern configuration example 1 (comparative example) for applying an electromagnetic field simulation of the terahertz oscillation device according to the third embodiment of the present invention.
Figure 28B:
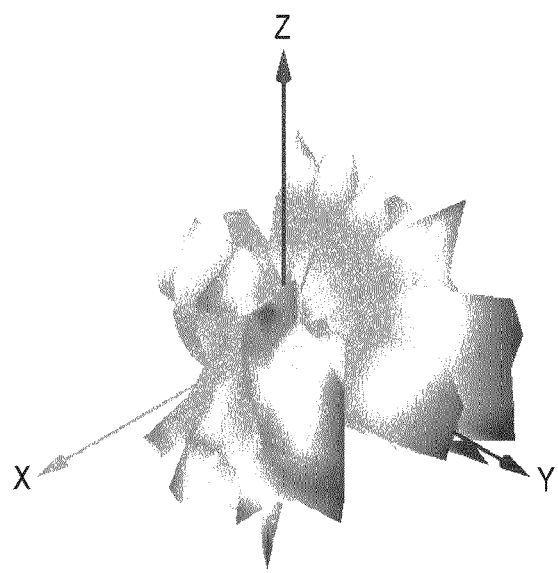
FIG. 28B shows an electromagnetic field simulation result of the electrode pattern configuration example 1 (comparative example) shown in FIG. 28A.
Figure 29A:
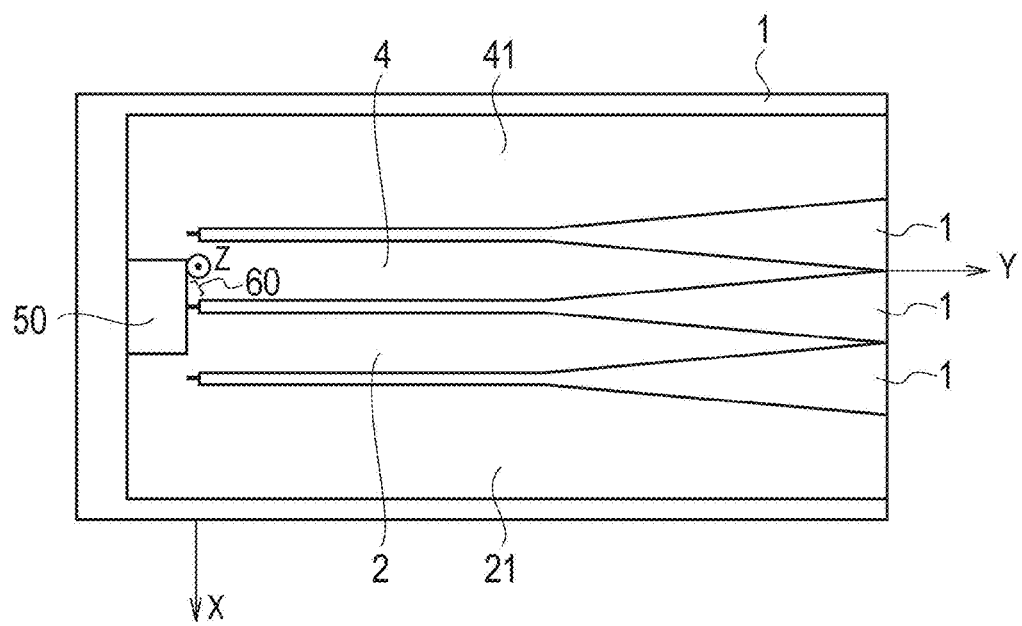
FIG. 29A shows an electrode pattern configuration example 2 for applying an electromagnetic field simulation of the terahertz oscillation device according to the third embodiment of the present invention.
Figure 29B:
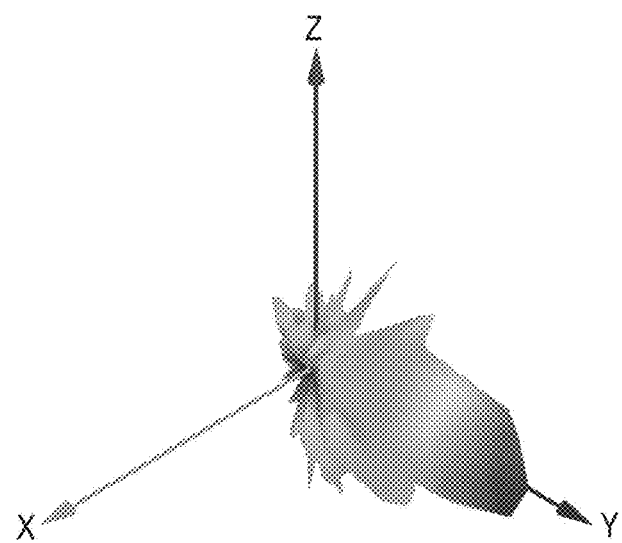
FIG. 29B shows an electromagnetic field simulation result of the electrode pattern configuration example 2 shown in FIG. 29A.

An electrode pattern configuration example 1 (comparative example) which applies a electromagnetic field simulation in the case of having only the first electrode 2 and the second electrode 4 as a comparative example is expressed as shown in FIG. 28A. An electromagnetic field simulation result of the electrode pattern configuration example 1 (comparative example) shown in FIG. 28A is expressed as shown in FIG. 28B. Moreover, an electrode pattern configuration example 2 which applies an electromagnetic field simulation of the terahertz oscillation device according to the third embodiment having one pair of the slot line electrodes 21 and 41 is expressed as shown in FIG. 29A. An electromagnetic field simulation result of the electrode pattern configuration example 2 shown in FIG. 29A is expressed as shown in FIG. 29B. In FIG. 28 and FIG. 29, all the oscillation frequency is 0.64 THz, and it proves that the directivity of the terahertz oscillation device according to the third embodiment having the slot line electrodes 21 and 41 is improving.

Figure 30A:
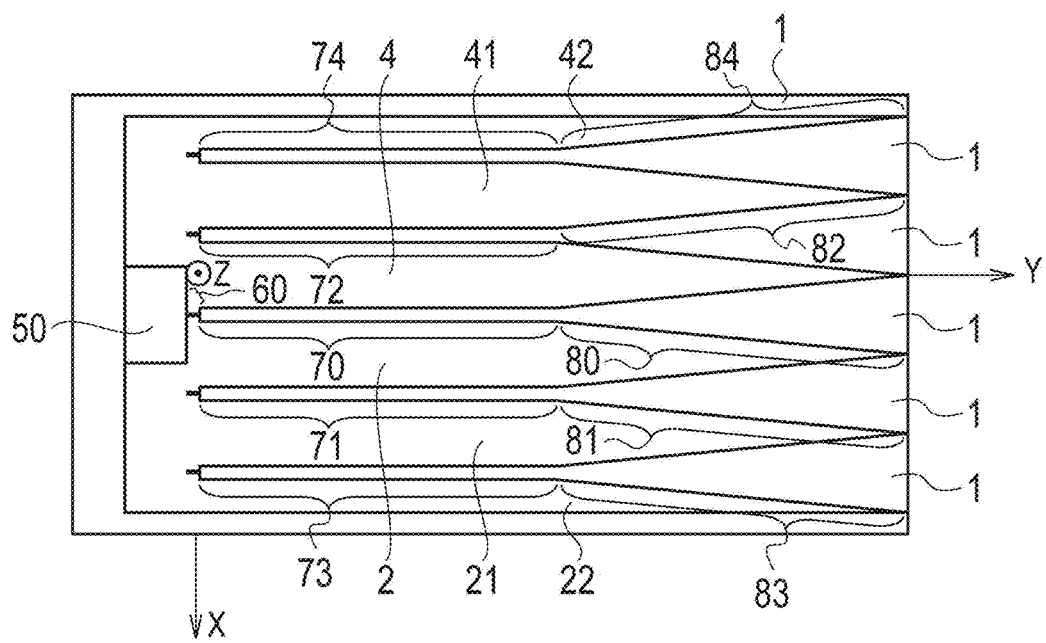
FIG. 30A shows an electrode pattern configuration example 3 for applying an electromagnetic field simulation of the terahertz oscillation device according to the third embodiment of the present invention.
Figure 30B:
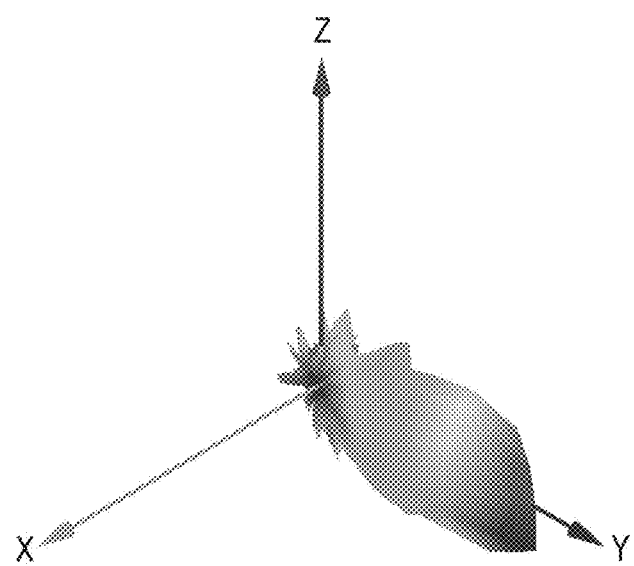
FIG. 30B shows an electromagnetic field simulation result of the electrode pattern configuration example 3 shown in FIG. 30A.

An electrode pattern configuration example 3 which applies an electromagnetic field simulation of the terahertz oscillation device according to the third embodiment is expressed as shown in FIG. 30A. An electromagnetic field simulation result of the electrode pattern configuration example 3 shown in FIG. 30A is expressed as shown in FIG. 30B.

The terahertz oscillation device having the electrode pattern configuration example 3 of FIG. 30A has the characteristic at the point which further places one pair of the slot line electrodes 22 and 42 in parallel for the electrode pattern configuration shown in FIG. 21. That is, the terahertz oscillation device having the electrode pattern configuration example 3 of FIG. 30A includes a slot line electrode 22 which is adjoining of the slot line electrode 21 on the semiconductor substrate 1, and opposes the slot line electrode 21 in the opposite side of the first electrode 2 to be placed; a slot line electrode 42 which is adjoining of the slot line electrode 41 on the semiconductor substrate 1, and opposes the slot line electrode 41 in the opposite side of the second electrode 4 to be placed; a waveguide 73 placed between the slot line electrode 21 and the slot line electrode 22 which oppose on the semiconductor substrate 1; a horn apertural area 83 which is adjoining of the waveguide 73 and is placed between the slot line electrode 21 and the slot line electrode 22 which oppose on the semiconductor substrate 1; a waveguide 74 placed between the slot line electrode 41 and the slot line electrode 42 which oppose on the semiconductor substrate 1; and a horn apertural area 84 which is adjoining of the waveguide 74 and is placed between the slot line electrode 41 and the slot line electrode 42 which oppose on the semiconductor substrate 1.

Also in FIG. 30, the oscillation frequency is 0.64 THz, and it proves that directivity is further improving by further placing one pair of the slot line electrodes 22 and 42 in parallel on the outside of the slot line electrodes 21 and 41.

According to the terahertz oscillation device according to the modified example of the third embodiment, the electromagnetic wave of the frequency band with the comparatively wide bandwidth oscillated from the oscillation device of the frequency variable can be oscillated in the horizontal direction to the substrate at a more high-efficiency and more high power over the oscillation frequency whole region, and it is also easy to be integrated, by placing the slot line electrode in parallel and generating the standing wave effectively.

Fourth Embodiment

Figure 31:
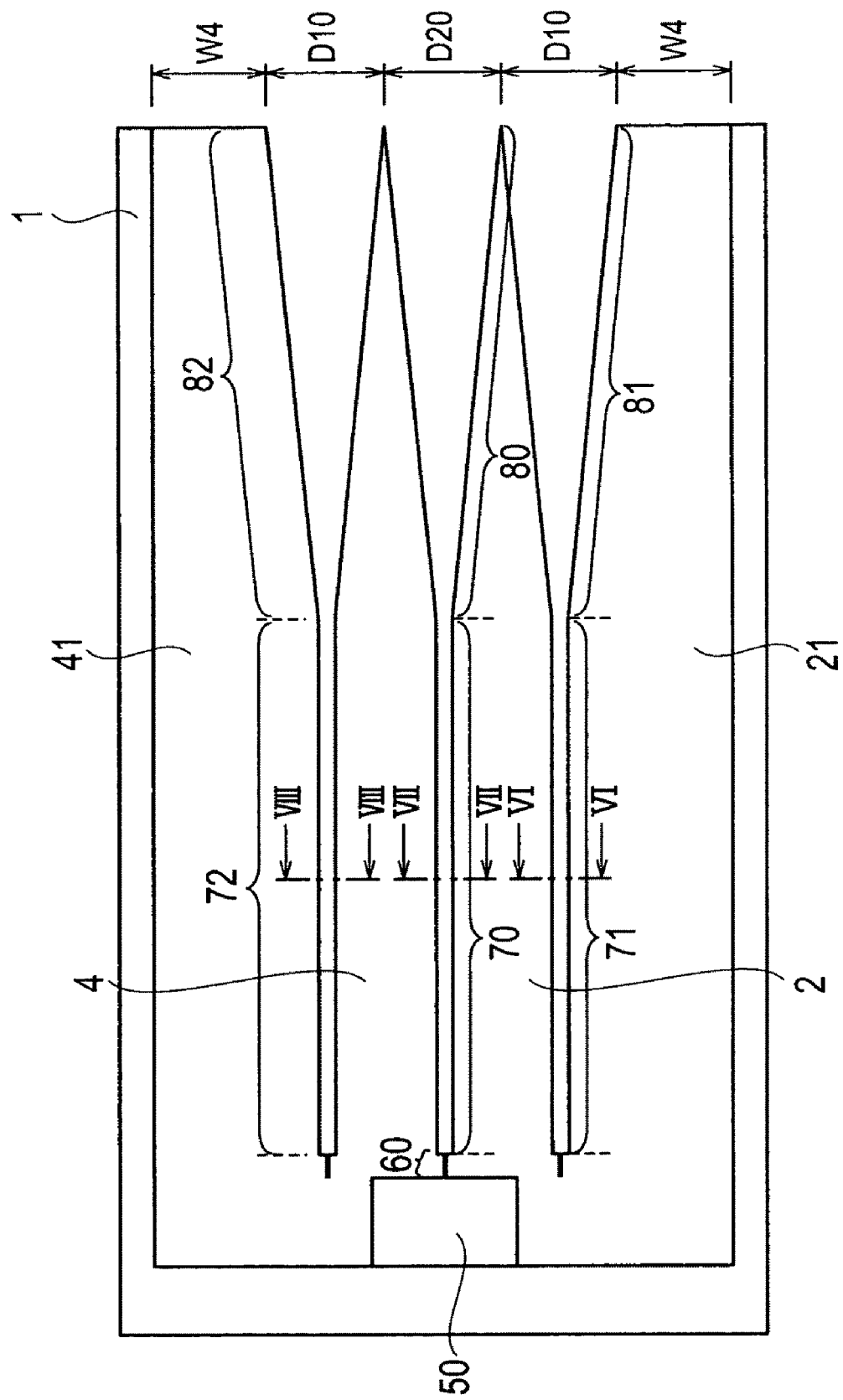
FIG. 31 is a schematic plan view of an electrode pattern structure of a terahertz oscillation device according to a fourth embodiment of the present invention.
Figure 32C:
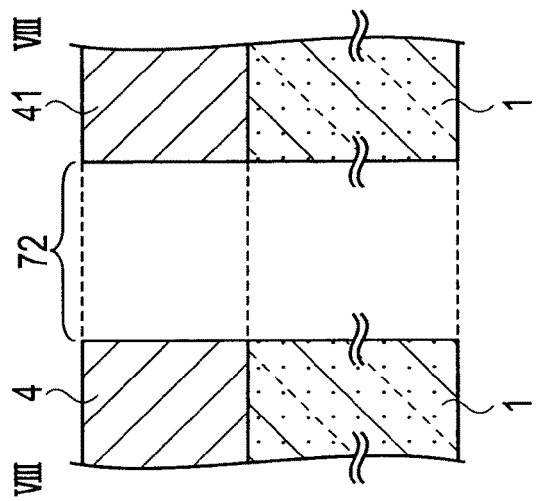
FIG. 32C is a schematic cross-sectional configuration chart taken in the line VIII-VIII of FIG. 31.
Figure 32B:
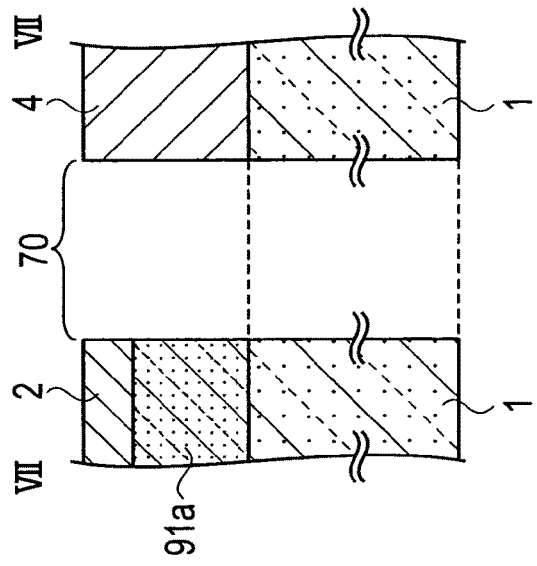
FIG. 32B is a schematic cross-sectional configuration chart taken in the line VII-VII of FIG. 31.
Figure 32A:
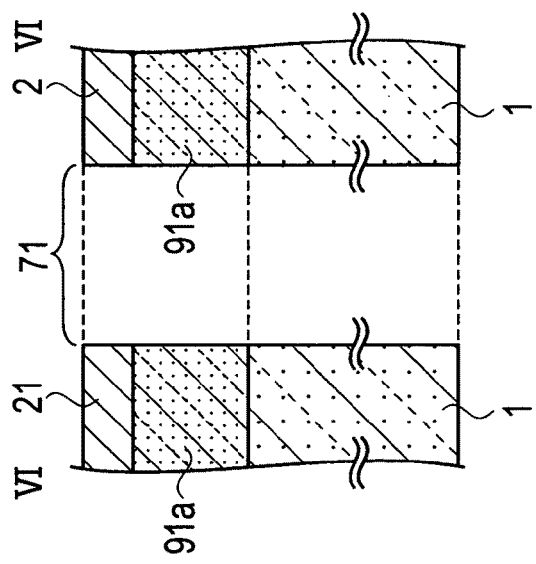
FIG. 32A is a schematic cross-sectional configuration chart taken in the line VI-VI of FIG. 31.

A schematic plane constitution of an electrode pattern structure of a terahertz oscillation device according to a fourth embodiment is expressed as shown in FIG. 31. Moreover, a schematic cross-section structure taken in the line VI-VI of FIG. 31 is expressed as shown in FIG. 32A, a schematic cross-section structure taken in the line VII-VII of FIG. 31 is expressed as shown in FIG. 32B, and a schematic cross-section structure taken in the line VIII-VIII of FIG. 31 is expressed as shown in FIG. 32C.

The semiconductor substrate 1 is thin-layered in the region which forms the resonator 60, the waveguides 70 to 72, and the horn apertural areas 80 to 82. Furthermore, as shown in FIG. 31 and FIG. 32, the semiconductor substrate 1 of the waveguides 70 to 72 and the horn apertural areas 80 to 82 may be removed completely. Since other configurations are the same as that of the third embodiment, the explanation of each part is omitted.

In the terahertz oscillation device according to the fourth embodiment, as shown in FIG. 31, the width W4 of the slot line electrodes 21 and 41 in the output terminal is about 160 µm, for example. Moreover, as shown in FIG. 31, the width D20 of the horn apertural area 80, the width D10 of the horn apertural areas 81 and 82, and the width W4 of the slot line electrodes 21 and 41 in the output terminal can be suitably changed, so that it may describe later.

Modified Example

Electrode pattern structures of the terahertz oscillation devices according to a modified example 1 to a modified example 7 of the fourth embodiment are expressed as shown in FIG. 33 to FIG. 39, respectively. The semiconductor substrate 1 is thin-layered in the region which forms the resonator 60, the waveguides 70 to 72, and the horn apertural areas 80 to 82. The semiconductor substrate 1 of the waveguides 70 to 72 and the horn apertural areas 80 to 82 may be removed completely.

Figure 33:
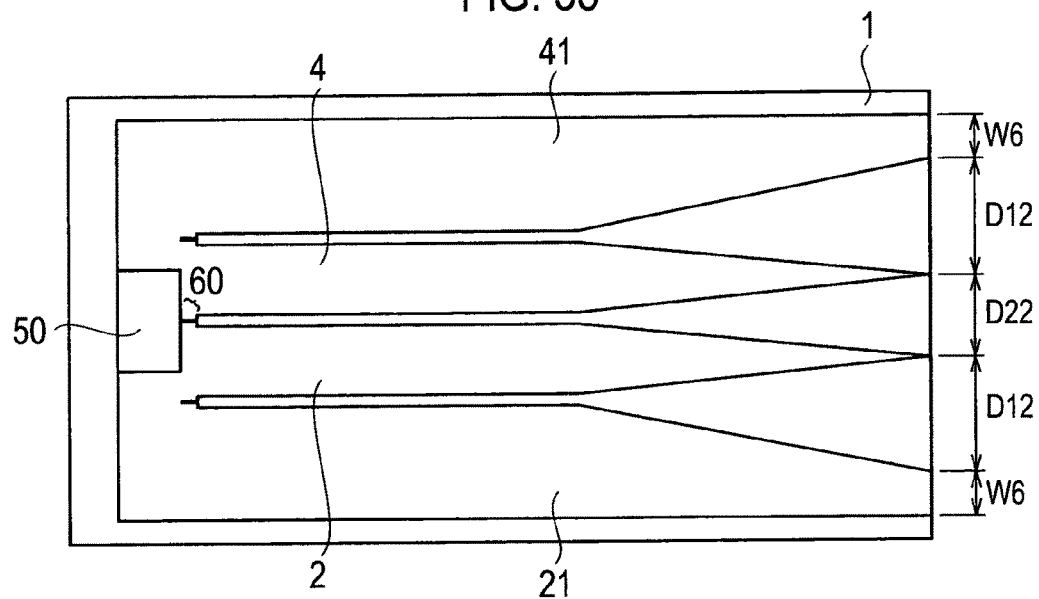
FIG. 33 is a schematic plan view of an electrode pattern structure of a terahertz oscillation device according to a modified example 1 of the fourth embodiment of the present invention.

In FIG. 33, the width D22 of the horn apertural area 80 in the output terminal is about 160 µm, for example, and the width D12 of the horn apertural areas 81 and 82 is about 220 µm, for example. The width W6 of the slot line electrodes 21 and 41 can be changed suitably.

Figure 34:
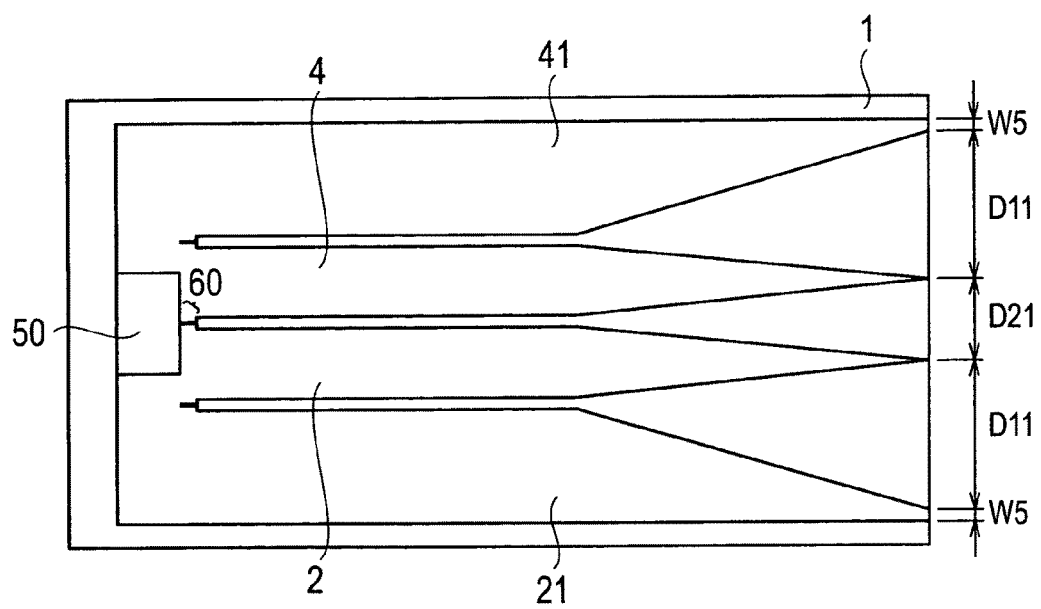
FIG. 34 is a schematic plan view of an electrode pattern structure of a terahertz oscillation device according to a modified example 2 of the fourth embodiment of the present invention.

In FIG. 34, the width D21 of the horn apertural area 80 in the output terminal is about 160 µm, for example, and the width D11 of the horn apertural areas 81 and 82 is about 300 µm, for example. The width W5 of the slot line electrodes 21 and 41 can be changed suitably.

Figure 35:
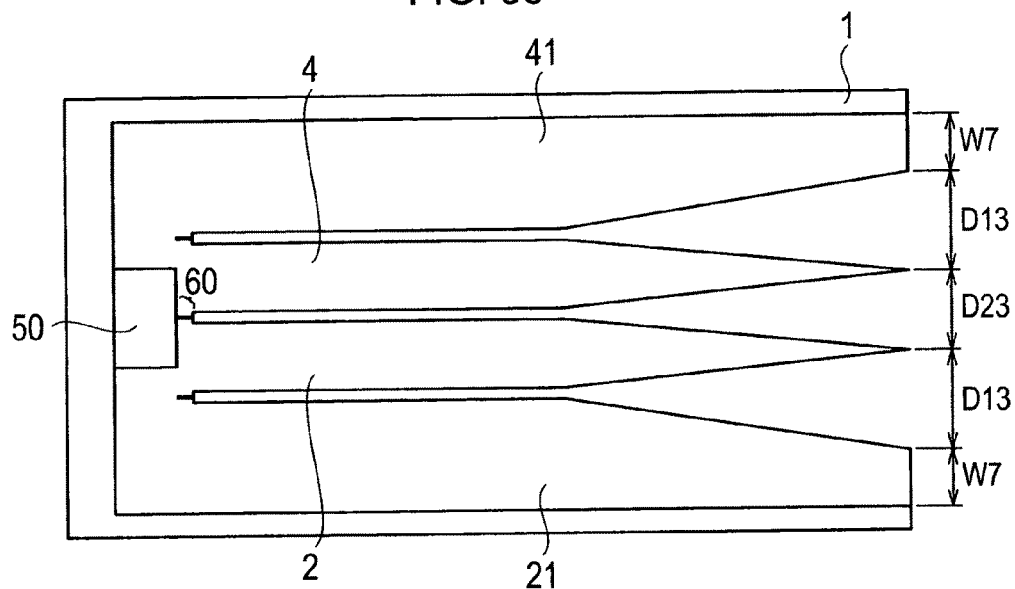
FIG. 35 is a schematic plan view of an electrode pattern structure of a terahertz oscillation device according to a modified example 3 of the fourth embodiment of the present invention.

In FIG. 35, the width D23 of the horn apertural area 80 in the output terminal is about 160 µm, for example, and the width D13 of the horn apertural areas 81 and 82 is about 200 µm, for example. The width W7 of the slot line electrodes 21 and 41 can be changed suitably.

Figure 36:
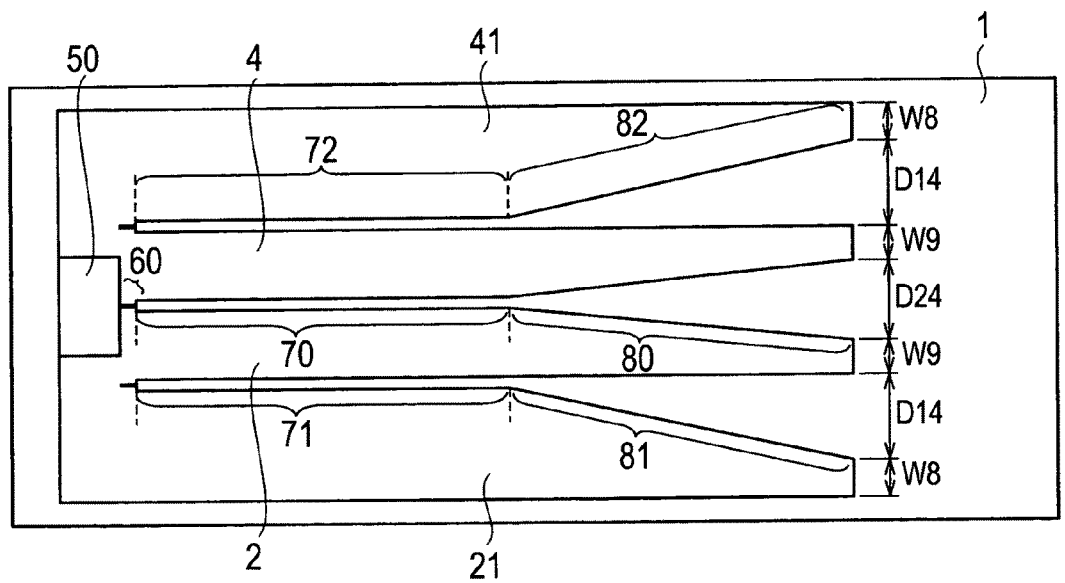
FIG. 36 is a schematic plan view of an electrode pattern structure of a terahertz oscillation device according to a modified example 4 of the fourth embodiment of the present invention.

In the modified example 4 shown in FIG. 36, one side of the tapered form of the first electrode 2 and the second electrode 4 has flat trapezoidal shape. The width D24 of the horn apertural area 80, the width D14 of the horn apertural areas 81 and 82, the width W8 of the slot line electrodes 21 and 41, and the width W9 of the first electrode 2 and the second electrode 4 in the output terminal can be changed suitably.

Figure 37:
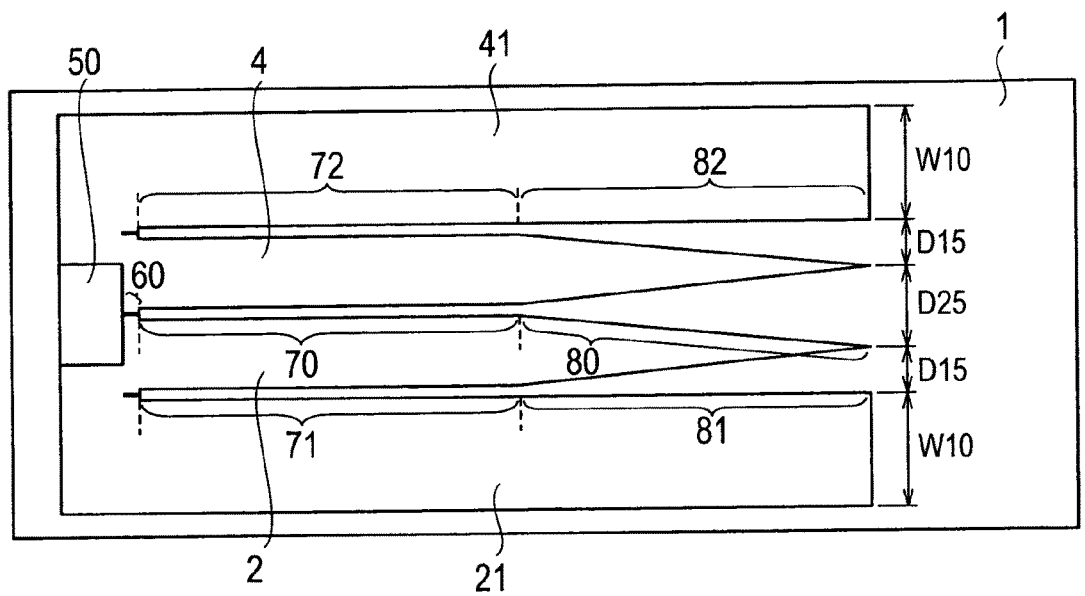
FIG. 37 is a schematic plan view of an electrode pattern structure of a terahertz oscillation device according to a modified example 5 of the fourth embodiment of the present invention.

In the modified example 5 shown in FIG. 37, only the first electrode 2 and the second electrode 4 are provided with tapered form, and the slot line electrodes 21 and 41 have rectangular shape without providing tapered form. The width D25 of the horn apertural area 80, the width D15 of the horn apertural areas 81 and 82, and the width W10 of the slot line electrodes 21 and 41 in the output terminal can be changed suitably.

Figure 38:
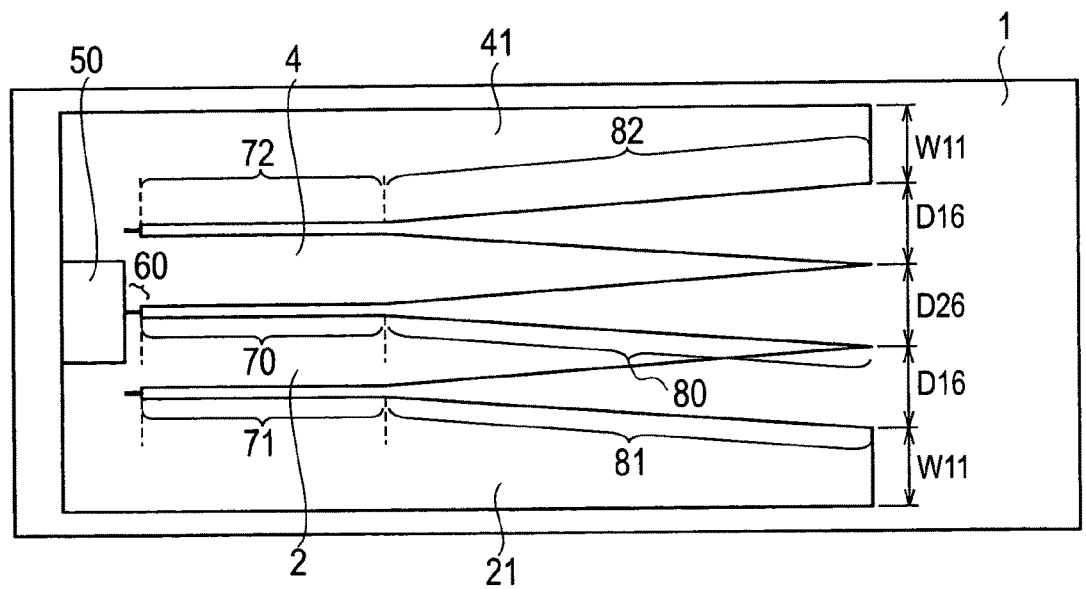
FIG. 38 is a schematic plan view of an electrode pattern structure of a terahertz oscillation device according to a modified example 6 of the fourth embodiment of the present invention.

In the modified example 6 shown in FIG. 38, the length of the waveguides 70 to 72 is set up short relatively, and the length of the horn apertural areas 80 to 82 is set up long relatively. The width D26 of the horn apertural area 80, the width D16 of the horn apertural areas 81 and 82, and the width W11 of the slot line electrodes 21 and 41 in the output terminal can be changed suitably.

Figure 39:
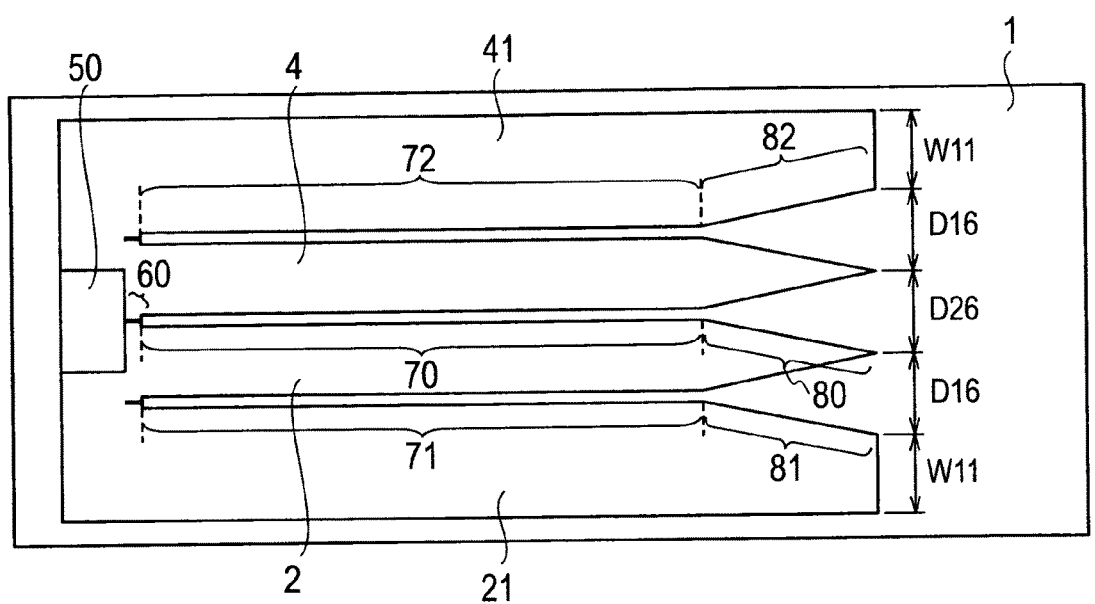
FIG. 39 is a schematic plan view of an electrode pattern structure of a terahertz oscillation device according to a modified example 7 of the fourth embodiment of the present invention.

In the modified example 7 shown in FIG. 39, the length of the waveguides 70 to 72 is set up long relatively, and the length of the horn apertural areas 80 to 82 is set up short relatively. The width D26 of the horn apertural area 80, the width D16 of the horn apertural areas 81 and 82, and the width W11 of the slot line electrodes 21 and 41 in the output terminal can be changed suitably.

According to the terahertz oscillation device according to the fourth embodiment, it becomes possible to inhibit the influence of the substrate, the directivity can be improved over the oscillation frequency whole region, the electromagnetic wave of the frequency band with the comparatively wide bandwidth oscillated from the oscillation device of the frequency variable can be oscillated in the horizontal direction to the substrate to the high-efficiency and the high power, and it is also easy to be integrated, by placing the slot line electrode in parallel, generating the standing wave effectively, and thin-layering the semiconductor substrate.

According to the terahertz oscillation device according to the fourth embodiment, it becomes possible to inhibit the influence of the substrate, and the directivity is improved in the direction horizontal to the substrate, and it becomes possible to emit the electromagnetic wave efficiently, by placing the slot line electrode in parallel, generating the standing wave effectively, and thin-layering the semiconductor substrate.

Other Embodiments

The present invention has been described by the first through fourth embodiments and their modifications, as a disclosure including associated description and drawings to be construed as illustrative, not restrictive. With the disclosure, artisan might easily think up alternative embodiments, embodiment examples, or application techniques.

In the third embodiment and the fourth embodiment, although the example which places one pair or two pairs for the slot line electrodes in parallel, and generates the standing wave effectively is disclosed, it may place more than three pairs of a plurality of pairs for the slot line electrodes.

Such being the case, the present invention covers a variety of embodiments, whether described or not.

INDUSTRIAL APPLICABILITY

The terahertz oscillation device of the present invention is applicable to wide fields, such as measurement in various fields, such as physical characteristics, astronomy, living things, etc., and the security field, besides THz imaging, and large capacity communication and information processing, as the oscillation and amplifying elements for operating in the frequency domain of the THz band.

REFERENCE SIGNS LIST

1: Conductor substrate;
2: First electrode;
3: Insulating layer;
4: Second electrode;
5, 6: Recessed region;
7: Protruded region;
8: Salient region;
13A, 13B: Stub;

15: DC power supply;
21, 22, 41, 42: Slot line electrode;
50: MIM reflector;
60: Resonator;
70, 71, 72, 73, 74: Waveguide;
80, 81, 82, 83, 84: Horn apertural area; and
90: Active element.

The invention claimed is:

1. A terahertz oscillation device comprising:
   a semiconductor substrate;
   a first electrode placed on the semiconductor substrate;
   an insulating layer placed on the first electrode;
   a second electrode which is placed via the insulating layer toward the first electrode, and opposes the first electrode to be placed on the semiconductor substrate;
   a MIM reflector formed between the first electrode and the second electrode by sandwiching the insulating layer;
   a resonator which is adjoining of the MIM reflector and is placed between the first electrode and the second electrode which oppose on the semiconductor substrate;
   an active element placed at the substantially central part of the resonator;
   a waveguide which is adjoining of the resonator and is placed between the first electrode and the second electrode which oppose on the semiconductor substrate; and
   a horn apertural area which is adjoining of the waveguide and is placed between the first electrode and the second electrode which oppose on the semiconductor substrate.

2. The terahertz oscillation device according to claim 1, wherein
   the active element is a resonant tunneling diode.

3. The terahertz oscillation device according to claim 1, wherein
   the horn apertural area composes an aperture horn antenna.

4. The terahertz oscillation device according to claim 1, wherein
   the waveguide is placed at an apertural area of the resonator.

5. The terahertz oscillation device according to claim 1, wherein
   the MIM reflector is placed at a closed unit of an opposite side of the apertural area of the resonator.

6. The terahertz oscillation device according to claim 1, wherein
   the first electrode includes a plurality of stubs in a part which composes the MIM reflector.

7. The terahertz oscillation device according to claim 1, wherein
   the second electrode includes a plurality of stubs in a part which composes the MIM reflector.

8. The terahertz oscillation device according to claim 6, wherein
   a plurality of the stubs are placed at equal intervals facing the resonator.

9. The terahertz oscillation device according to claim 6, wherein
   a plurality of the stubs are placed at variable intervals facing the resonator.

10. The terahertz oscillation device according to claim 1, wherein
    the semiconductor substrate is thin-layered in a region to which the resonator, the waveguide, and the first electrode and the second electrode which form the horn apertural area are placed.

11. The terahertz oscillation device according to claim 1, wherein
    an interval between the first electrode and the second electrode of a part in which the resonator is formed is narrow compared with an interval between the first electrode and the second electrode in the waveguide.

12. A terahertz oscillation device comprising:
    a semiconductor substrate;
    a first electrode placed on the semiconductor substrate;
    an insulating layer placed on the first electrode;
    a second electrode which is placed via the insulating layer toward the first electrode, and opposes the first electrode to be placed on the semiconductor substrate;
    a slot line electrode which is adjoining of the first electrode on the semiconductor substrate, and is placed in an opposite side of the second electrode opposing the first electrode;
    a slot line electrode which is adjoining of the second electrode on the semiconductor substrate, and is placed in an opposite side of the first electrode opposing the second electrode;
    a MIM reflector formed between the first electrode and the second electrode by sandwiching the insulating layer;
    a resonator which is adjoining of the MIM reflector and is placed between the first electrode and the second electrode which oppose on the semiconductor substrate;
    an active element placed at the substantially central part of the resonator;
    a first horn waveguide which is adjoining of the resonator and is placed between the first electrode and the second electrode which oppose on the semiconductor substrate;
    a first horn apertural area which is adjoining of the first waveguide and is placed between the first electrode and the second electrode which oppose on the semiconductor substrate;
    a second waveguide placed between the first electrode and the first slot line electrode which oppose on the semiconductor substrate;
    a second horn apertural area which is adjoining of the second waveguide and is placed between the first electrode and the first slot line electrode which oppose on the semiconductor substrate;
    a third waveguide placed between the second electrode and the second slot line electrode which oppose on the semiconductor substrate; and
    a third horn apertural area which is adjoining of the third waveguide and is placed between the second electrode and the second slot line electrode which oppose on the semiconductor substrate.

13. The terahertz oscillation device according to claim 12 comprising:
    the active element is a resonant tunneling diode.

14. The terahertz oscillation device according to claim 12, wherein
    the first horn apertural area, the second horn apertural area, and the third horn apertural area compose an aperture horn antenna.

15. The terahertz oscillation device according to claim 12, wherein
    the first waveguide is placed at an apertural area of the resonator.

16. The terahertz oscillation device according to claim 12, wherein
    the MIM reflector is placed at a closed unit of an opposite side of the apertural area of the resonator.

17. The terahertz oscillation device according to claim 12, wherein
    the first electrode includes a plurality of stubs in a part which composes the MIM reflector.

18. The terahertz oscillation device according to claim 12, wherein
    the second electrode includes a plurality of stubs in a part which composes the MIM reflector.

19. The terahertz oscillation device according to claim 12 further comprising:
- a third slot line electrode which is adjoining of the first slot line electrode on the semiconductor substrate, and is placed in an opposite side of the first electrode opposing the first slot line electrode;
- a fourth slot line electrode which is adjoining of the second slot line electrode on the semiconductor substrate, and is placed in an opposite side of the second electrode opposing the second slot line electrode;
- a fourth waveguide placed between the first slot line electrode and the third slot line electrode which oppose on the semiconductor substrate;
- a fourth horn apertural area which is adjoining of the fourth waveguide and is placed between the first slot line electrode and the third slot line electrode which oppose on the semiconductor substrate;
- a fifth waveguide placed between the second slot line electrode and the fourth slot line electrode which oppose on the semiconductor substrate; and
- a fifth horn apertural area which is adjoining of the fifth waveguide and is placed between the second slot line electrode and the fourth slot line electrode which oppose on the semiconductor substrate.

20. The terahertz oscillation device according to claim 12, wherein
- the semiconductor substrate is thin-layered in a region which forms the resonator, the waveguide, and the horn apertural area.

* * * * *